(12) United States Patent
Li

(10) Patent No.: US 12,406,628 B2
(45) Date of Patent: Sep. 2, 2025

(54) DISPLAY PANEL AND DISPLAY APPARATUS

(71) Applicant: WUHAN TIANMA MICRO-ELECTRONICS CO., LTD., Wuhan (CN)

(72) Inventor: Fei Li, Wuhan (CN)

(73) Assignee: Wuhan Tianma Micro-electronics Co., Ltd., Wuhan (CN)

( * ) Notice: Subject to any disclaimer, the term of this patent is extended or adjusted under 35 U.S.C. 154(b) by 86 days.

(21) Appl. No.: 18/587,366

(22) Filed: Feb. 26, 2024

(65) Prior Publication Data
US 2024/0194144 A1    Jun. 13, 2024

(30) Foreign Application Priority Data
Mar. 1, 2023 (CN) .......................... 202310198086.2

(51) Int. Cl.
*G09G 3/32* (2016.01)
*G09G 3/3258* (2016.01)
(Continued)

(52) U.S. Cl.
CPC ......... *G09G 3/3258* (2013.01); *G09G 3/3275* (2013.01); *H10K 59/1213* (2023.02);
(Continued)

(58) Field of Classification Search
CPC ............... G09G 3/3258; G09G 3/3275; G09G 2310/061; G09G 2320/0233; G09G 2320/0247; G09G 3/3233; H10K 59/1213; H10K 59/1216; H10K 59/131; H10K 59/353; H10K 59/00
See application file for complete search history.

(56) References Cited

U.S. PATENT DOCUMENTS

2017/0033171 A1*  2/2017  Kim ...................... G09G 3/3233
2021/0202621 A1*  7/2021  Liang .................... H10K 59/124
(Continued)

FOREIGN PATENT DOCUMENTS

CN       108933155 A      12/2018
CN       113078196 A      7/2021

OTHER PUBLICATIONS

First Office Action (with English translation) received May 20, 2025 for Chinese Application No. 202310198086.2, filed Mar. 1, 2023; 19 pages total.

*Primary Examiner* — Pegeman Karimi
(74) *Attorney, Agent, or Firm* — Christensen O'Connor Johnson Kindness PLLC

(57) ABSTRACT

Provided are a display panel and a display apparatus. The display panel includes a substrate, a drive layer, and a pixel layer. The pixel layer is located at a side of the drive layer away from the substrate. The drive layer includes a first metal layer that is a metal layer that is closer to the pixel layer in the drive layer. The first metal layer includes data lines and a first signal line that extend in a same direction. The first signal line transmits a constant voltage signal. The pixel layer includes a plurality of sub-pixels, and each sub-pixel includes a light-emitting region. The light-emitting region is located between adjacent data lines. The first signal line overlaps with centers of the light-emitting regions of some of the sub-pixels.

25 Claims, 18 Drawing Sheets

(51) Int. Cl.
*G09G 3/3275* (2016.01)
*H10K 59/121* (2023.01)
*H10K 59/131* (2023.01)
*H10K 59/35* (2023.01)

(52) U.S. Cl.
CPC ....... *H10K 59/1216* (2023.02); *H10K 59/131* (2023.02); *H10K 59/353* (2023.02); *G09G 2310/061* (2013.01); *G09G 2320/0233* (2013.01); *G09G 2320/0247* (2013.01)

(56) References Cited

U.S. PATENT DOCUMENTS

2022/0158140 A1\* 5/2022 Liu .................... H10K 59/8792
2022/0277691 A1\* 9/2022 Wang .................. H10K 59/131

\* cited by examiner

DISPLAY PANEL AND DISPLAY APPARATUS

CROSS-REFERENCE TO RELATED APPLICATIONS

The present application claims priority to Chinese Patent Application No. 202310198086.2, filed on Mar. 1, 2023, the content of which is incorporated herein by reference in its entirety.

TECHNICAL FIELD

The present disclosure relates to the technical field of display, and in particular, to a display panel and a display apparatus.

BACKGROUND

Organic Light-Emitting Diodes (OLEDs) are light-emitting elements that emit light spontaneously without requiring an additional light source. This is advantageous for making display apparatuses thinner and lighter, and also facilitates the production of flexible display screens. The organic self-luminous technology also has fast response and wide viewing angles, thus becoming popular in the display industry.

A sub-pixel at a specific location in the display panel may suffer from brightness differences when viewed from different angles. The brightness differences of the sub-pixel at different viewing angles can cause color shift issues during display with sub-pixels emitting lights of different colors, and inconsistent color shift in the four directions of up, down, left, and right when viewed from the front of the display panel. This is commonly known as the four-directional color shift.

SUMMARY

Embodiments of the present disclosure provide a display panel and a display apparatus.

According to one aspect, a display panel is provided. The display panel includes: a substrate, a drive layer, and a pixel layer located at a side of the drive layer away from the substrate. The drive layer includes a first metal layer that is a metal layer that is closer to the pixel layer among metal layers in the drive layer. The first metal layer includes data lines and a first signal line that extend in a same direction, and the first signal line transmits a constant voltage signal. The pixel layer includes a plurality of sub-pixels, and each sub-pixel includes a light-emitting region. The light-emitting region is located between adjacent data lines, and the first signal line overlaps with centers of the light-emitting regions of some of the sub-pixels.

According to another aspect, provided is a display apparatus including a display panel. The display panel includes: a substrate, a drive layer, and a pixel layer located at a side of the drive layer away from the substrate. The drive layer includes a first metal layer that is a metal layer closest to the pixel layer among metal layers in the drive layer. The first metal layer includes data lines and a first signal line that extend in a same direction, and the first signal line transmits a constant voltage signal. The pixel layer includes a plurality of sub-pixels, and each sub-pixel includes a light-emitting region. The light-emitting region is located between adjacent data lines, and the first signal line overlaps with centers of the light-emitting regions of some of the sub-pixels.

BRIEF DESCRIPTION OF DRAWINGS

To describe the technical solutions in the embodiments of the present disclosure or in the prior art more clearly, the following briefly describes the accompanying drawings required for describing the embodiments or the prior art. The accompanying drawings in the following description show some embodiments of the present disclosure, and a person skilled in the art may still derive other drawings from these accompanying drawings.

DESCRIPTION OF EMBODIMENTS

In order to make the objectives, technical solutions and advantages of the embodiments of the present disclosure clearer, the technical solutions in the embodiments of the present disclosure will be described below in conjunction with the drawings in the embodiments of the present disclosure. Obviously, the described embodiments are some, rather than all of the embodiments of the present disclosure. All other embodiments obtained by those of ordinary skill in the art based on the embodiments of the present disclosure should fall within the protection scope of the present disclosure.

Terms used in the embodiments of the present disclosure are only for the purpose of describing specific embodiments, and are not intended to limit the present disclosure. Unless otherwise specified in the context, words, such as "a", "the", and "this", in a singular form in the embodiments of the present disclosure and the appended claims include plural forms.

The display panel includes sub-pixels and a drive layer located below the sub-pixels. Signal lines in the drive layer are located below the sub-pixels and cause the sub-pixels to be formed on an uneven base, resulting in differences in the amount of light emitted by the sub-pixels in directions tilting towards four sides, thus causing the four-directional color shift of the display panel.

To solve this problem, in the embodiments of present disclosure, overlapping positions between the sub-pixels and the wirings in the drive layer are designed. The light-emitting region of each sub-pixel is arranged between adjacent data lines, and the first signal line in the same layer as the data lines overlaps with the centers of the light-emitting regions of some sub-pixels. This design reduces brightness differences of the sub-pixels that overlap with the first signal line in different viewing angles, thereby alleviating the four-directional color shift of the display panel and enhancing the display effect.

Embodiments of the present disclosure provide a display panel. The display panel includes a substrate, and a drive layer and a pixel layer that are located at one side of the substrate. The drive layer includes pixel circuits and a plurality of wiring lines. The wiring lines in the drive layer at least include data lines, scanning lines, reset signal lines, power signal lines, and light-emitting control lines. The pixel layer includes a plurality of sub-pixels. Each sub-pixel includes a first electrode, a light-emitting layer, and a second electrode that are stacked. The sub-pixel is an organic light-emitting element or an inorganic light-emitting element. The pixel circuit is electrically connected to the sub-pixel and is configured to drive the sub-pixel to emit light.

Figure 1:
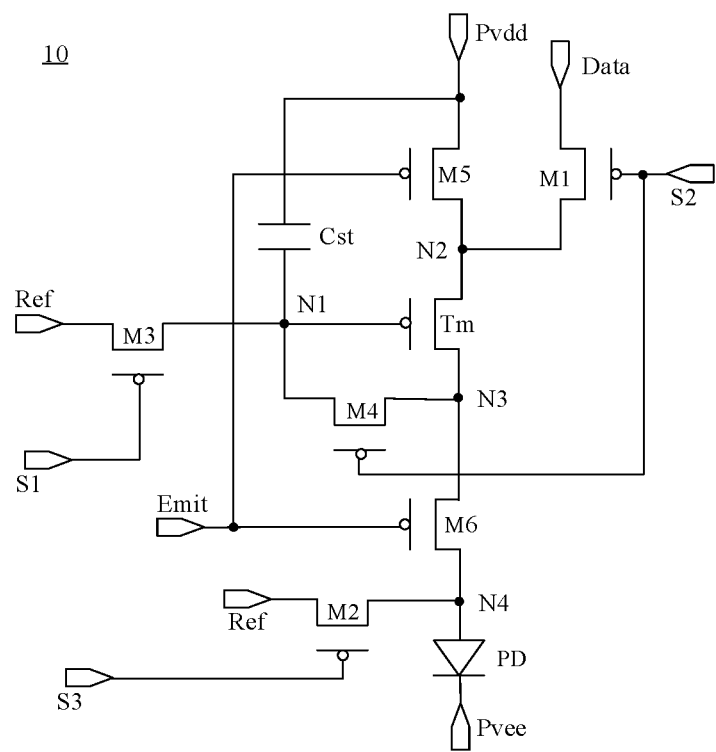
FIG. 1 is a schematic diagram of a pixel circuit according to an embodiment of the present disclosure.

FIG. 1 is a schematic diagram of a pixel circuit according to an embodiment of the present disclosure. As shown in FIG. 1, the pixel circuit 10 includes a drive transistor Tm, a data writing transistor M1, an electrode reset transistor M2, a gate reset transistor M3, a threshold compensation transistor M4, a first light-emitting control transistor M5, and a second light-emitting control transistor M6. The drive transistor Tm is connected in series between the first light-emitting control transistor M5 and the second light-emitting control transistor M6. A gate of the drive transistor Tm is connected to a first node N1. The drive transistor Tm has a first electrode connected to a second node N2 and a second electrode connected to a third node N3. The gate reset transistor M3 is connected to the first node N1. The data writing transistor M1 and the first light-emitting control transistor M5 are connected to the second node N2. The threshold compensation transistor M4 is connected in series between the first node N1 and the third node N3. The second light-emitting control transistor M6 has a first electrode connected to the third node N3 and a second electrode connected to a fourth node N4. The electrode reset transistor M2 is connected to the fourth node N4. The light-emitting element PD has one electrode connected to the fourth node N4 and the other electrode receiving a negative power signal Pvee. A gate of the gate reset transistor M3 receives a scanning signal S1. A gate of the electrode reset transistor M2 receives a scanning signal S3. A gate of the data writing transistor M1 and a gate of the threshold compensation transistor M4 receive a scanning signal S2. A gate of the first light-emitting control transistor M5 and a gate of the second light-emitting control transistor M6 receive a light-emitting control signal Emit. When driving a pixel circuit 10 to operate, the scanning signal S3 can be the same as the scanning signal S1, or the scanning signal S3 can be the same as the scanning signal S2. To drive the pixel circuit 10, a scanning line and a light-emitting control line need to be set in the display panel. The scanning line provides a scanning signal, and the light-emitting control line provides a light-emitting control signal. In addition, a reset signal line providing a reset signal Ref, a data line providing a data signal Data, and a power signal line providing a positive power signal Pvdd need to be set. A storage capacitor Cst in the pixel circuit 10 has one electrode plate connected to the first node N1, and the other electrode plate connected to the positive power signal Pvdd.

Figure 2:
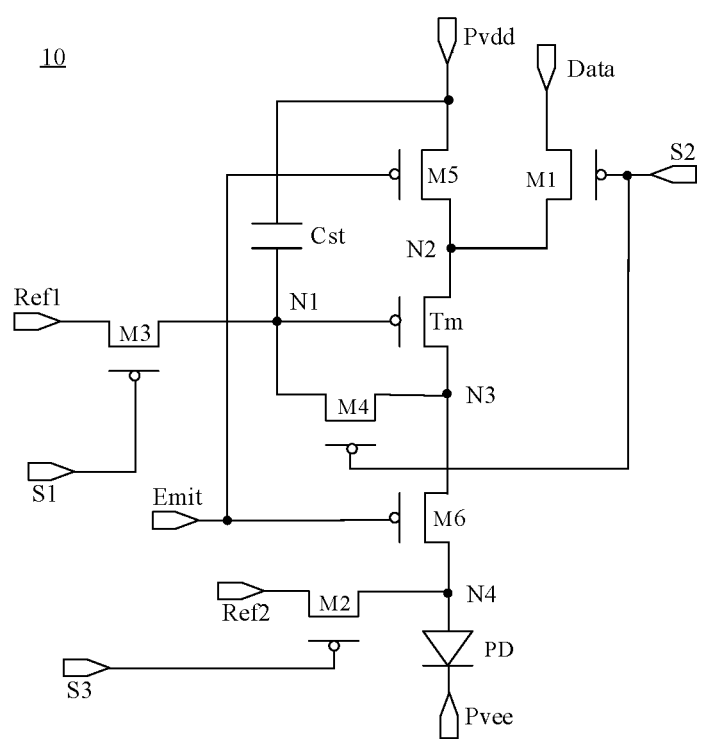
FIG. 2 is a schematic diagram of another pixel circuit according to an embodiment of the present disclosure.

In FIG. 1, both the electrode reset transistor M2 and the gate reset transistor M3 receive the reset signal Ref, that is, the electrode reset transistor M2 and the gate reset transistor M3 receive the same reset signal. In other embodiments, the electrode reset transistor M2 and the gate reset transistor M3 receive different reset signals. FIG. 2 is a schematic diagram of another pixel circuit according to an embodiment of the present disclosure. As shown in FIG. 2, the gate reset transistor M3 receives a first reset signal Ref1, and the electrode reset transistor M2 receives a second reset signal Ref2. The first reset signal Ref1 is provided by a first reset signal line, and the second reset signal Ref2 is provided by a second reset signal line. Voltage values of the first reset signal and the second reset signal are different.

In FIG. 1 and FIG. 2, the transistors in the pixel circuit 10 are all p-type transistors. In other embodiments, the transistors in the pixel circuit 10 are all n-type transistors, this layout not being illustrated in the figure herein.

In other embodiments, the gate reset transistor M3 and the threshold compensation transistor M4 are n-type transistors, while all the other transistors are p-type transistors. An active layer of the gate reset transistor M3 and an active layer of the threshold compensation transistor M4 contain metal oxide, while active layers of the other transistors contain silicon. In this way, the leakage current from the gate reset transistor M3 and the threshold compensation transistor M4 to the first node N1 can be reduced, which can improve the potential stability of the first node N1, and alleviate the problems of flickering of the display panel at low frequencies.

Figure 3:
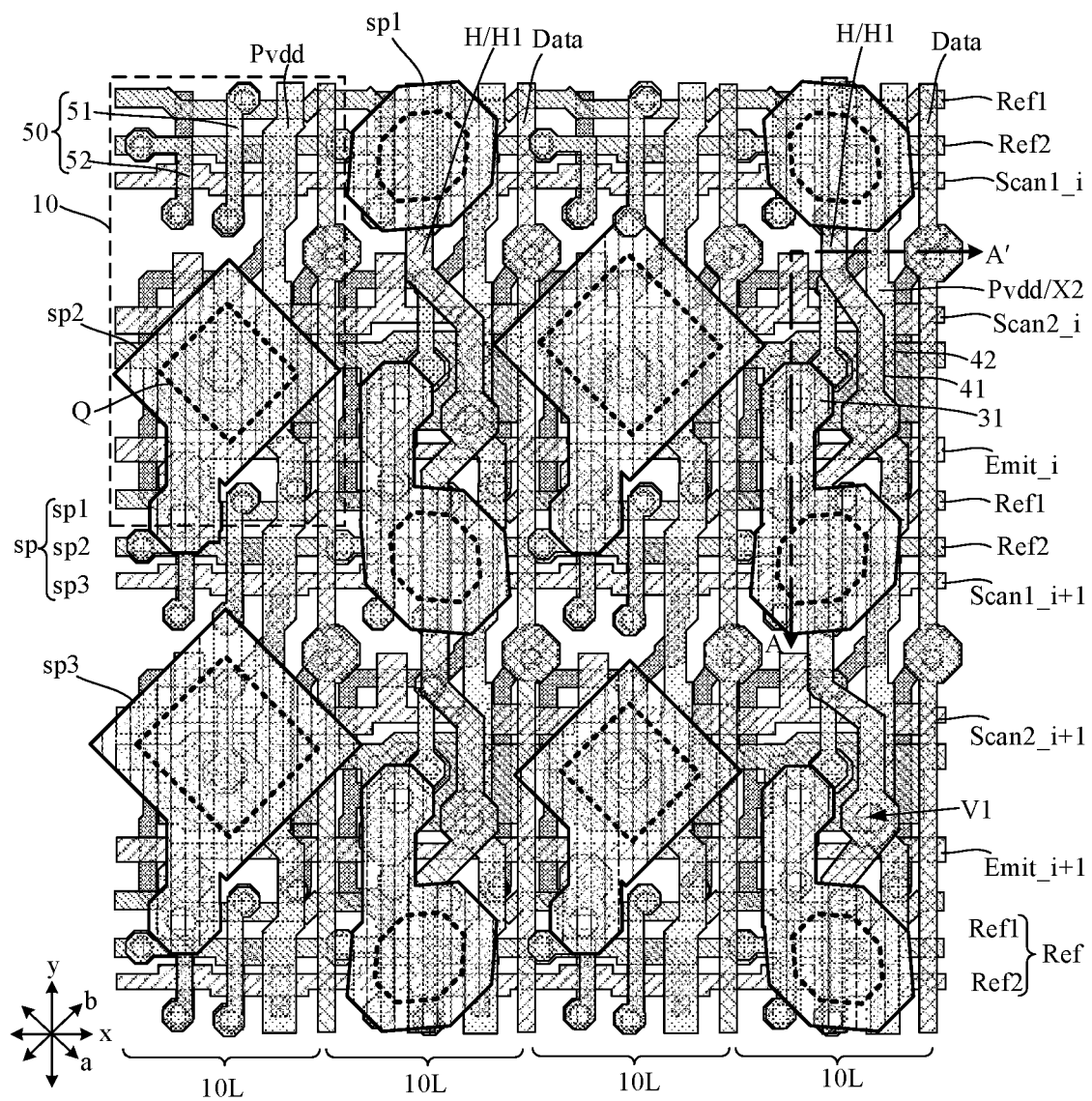
FIG. 3 is a partial schematic diagram of a display panel according to an embodiment of the present disclosure.
Figure 4:
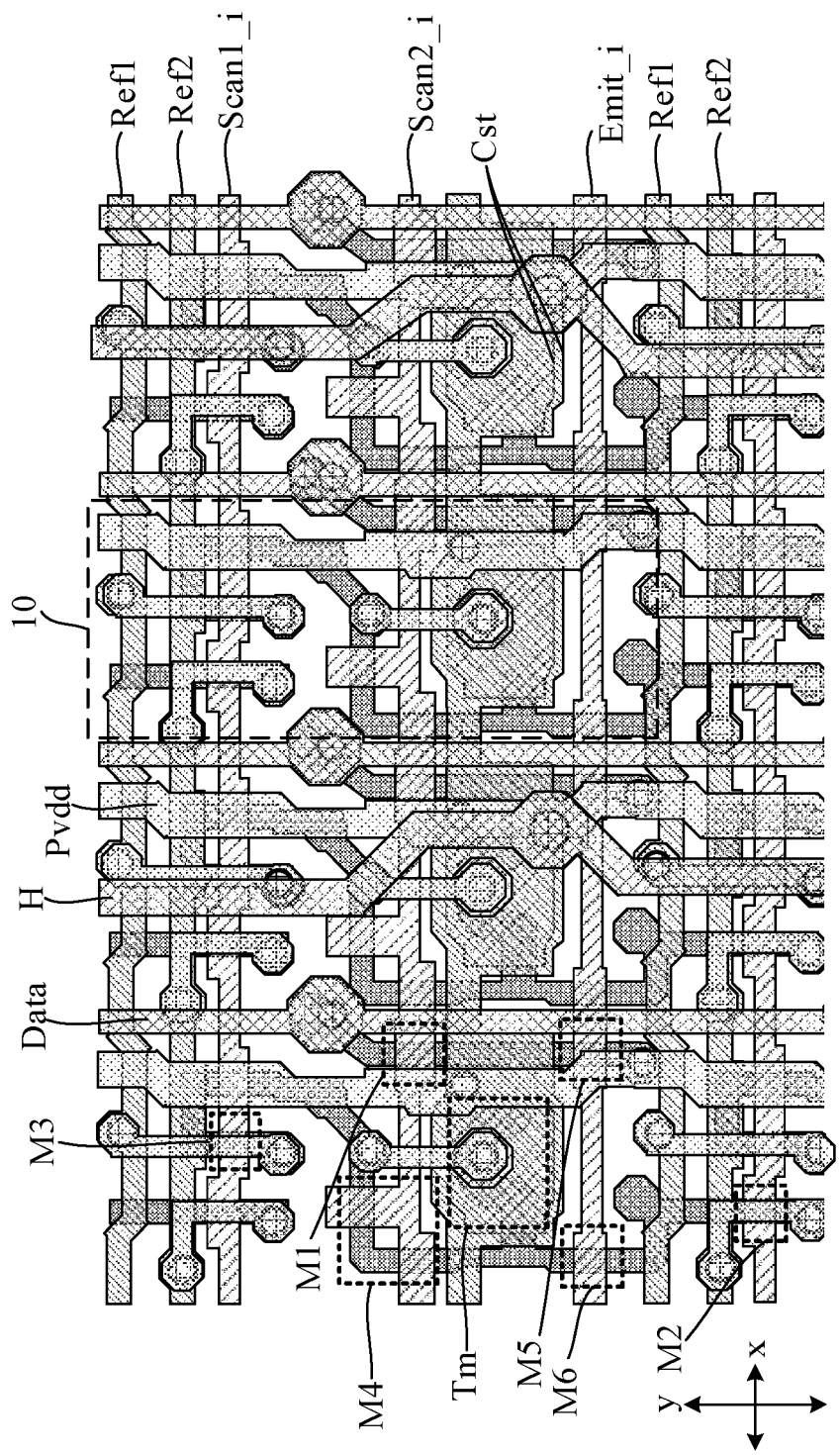
FIG. 4 is a schematic diagram of a pixel circuit in the embodiment shown in FIG. 3.
Figure 5:
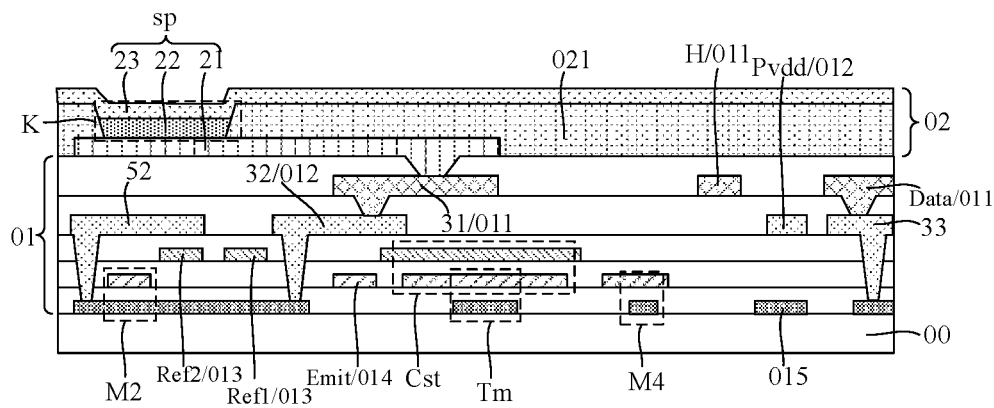
FIG. 5 is a schematic cross-sectional view taken along line A-A' shown in FIG. 3.

FIG. 3 is a partial schematic diagram of a display panel according to an embodiment of the present disclosure; FIG. 4 is a schematic diagram of a pixel circuit in the embodiment shown in FIG. 3; and FIG. 5 is a schematic cross-sectional view taken along line A-A' shown in FIG. 3.

As shown in FIG. 3, the display panel includes a plurality of sub-pixels sp, and the sub-pixels sp include first sub-pixels sp1, second sub-pixels sp2, and third sub-pixels sp3. The first sub-pixel sp1, the second sub-pixel sp2, and the third sub-pixel sp3 emit light of different colors. The display panel is provided with data lines Data and a first signal line H that extend in the same direction. The first signal line H transmits a constant voltage signal. The data lines Data transmit data signals Data. The data lines and data signals are marked with the same signs.

FIG. 3 shows eight pixel circuits 10 arranged in two rows (the i-th pixel circuit row and the (i+1)-th pixel circuit row) and four columns, where i is a positive integer. The pixel circuits 10 in FIG. 3 can be understood with reference to the embodiment shown in FIG. 2. FIG. 3 shows the row direction x and the column direction y of the arrangement of the pixel circuits 10, where the pixel circuits 10 are arranged in the row direction x to form a pixel circuit row. To illustrate the structure of the pixel circuit 10 more clearly, FIG. 4 shows four pixel circuits 10 in the i-th pixel circuit row. Transistors are not labeled with signs in FIG. 3. FIG. 4 shows positions of the drive transistor Tm, the data writing transistor M1, the electrode reset transistor M2, the gate reset transistor M3, the threshold compensation transistor M4, the first light-emitting control transistor M5, the second light-emitting control transistor M6, and the storage capacitor Cst in the pixel circuit 10.

As shown in FIG. 3, the display panel further includes first scanning lines Scan1_i and Scan1_i+1, second scanning lines Scan2_i and Scan2_i+1, light-emitting control lines Emit_i and Emit_i+1, a power signal line Pvdd, and a reset signal line Ref. The reset signal line Ref includes a first reset signal line Ref1 and a second reset signal line Ref2. The reset signal line and the reset signal are marked with the same sign. The power signal line Pvdd transmits a positive power signal Pvdd. The power signal line Pvdd and the positive power signal Pvdd are marked with the same sign. The first scanning line Scan1_i, the second scanning line Scan2_i, and the light-emitting control line Emit_i are configured to drive the pixel circuits in the i-th pixel circuit row, while the first scanning line Scan1_i+1, the second scanning line Scan2_i+1, and the light-emitting control line Emit_i+1 are configured to drive the pixel circuits in the (i+1)-th pixel circuit row. The first scanning line and the second scanning line driving the same pixel circuit row are connected to shift registers of two adjacent stages in the same scan driving circuit. For example, an output terminal of the shift register of the i-th stage is connected to the first scanning line Scan1_i, and an output terminal of the shift register of the (i+1)-th stage is connected to the second scanning line Scan2_i. In addition, the output terminal of the shift register of the i-th stage is also connected to the second scanning line Scan2_i−1 (for driving the (i−1)-th pixel circuit row), and the output terminal of the shift register of the (i+1)-th stage is also connected to the first scanning line Scan1_i+1. In other words, the second scanning line Scan2_i and the first scanning line Scan1_i+1 transmit the same signal. Furthermore, the light-emitting control lines Emit_i and Emit_i+1 control lines are connected to shift registers of two adjacent stages in the same light-emitting drive circuit.

Taking the pixel circuit 10 in the i-th pixel circuit row as an example, the gate of the electrode reset transistor M2 in the pixel circuit 10 is connected to the first scanning line Scan1_i+1, the gate of the gate reset transistor M3 is connected to the first scanning line Scan1_i, and the gate of the threshold compensation transistor M4 and the gate of the data writing transistor M1 are connected to the second scanning line Scan2_i. That is, the gate of the electrode reset transistor M2 and the gate of the data writing transistor M1 receive the same signal. A working cycle of the pixel circuit 10 includes a gate reset phase, a data writing phase, and a light-emitting phase. First, in the gate reset phase, the first scanning line Scan1_i provides an enable signal, and the enable signal turns on the gate reset transistor M3 to reset the gate of the drive transistor Tm. Next, in the data write phase, the second scanning line Scan2_i provides an enable signal to turn on the threshold compensation transistor M4 and the data writing transistor M1, such that a data voltage is inputted into the source of the drive transistor Tm and a threshold voltage of the drive transistor Tm is compensated. At the same time, in this phase, the first scanning line Scan1_i+1 provides an enable signal to control the electrode reset transistor M2 to turn on and reset the electrode of the light-emitting element. Finally, in the light-emitting phase, the drive transistor Tm generates a drive current under the control of a gate voltage thereof.

As shown in FIG. 4, the display panel includes a substrate 00, a drive layer 01, and a pixel layer 02, with the pixel layer 02 located at a side of the drive layer 01 away from the substrate 00. The sub-pixel sp is located in the pixel layer 02, and the pixel circuit 10 is located in the drive layer 01. The sub-pixel sp includes a first electrode 21, a light-emitting layer 22, and a second electrode 23 that are stacked. The first electrodes 21 of adjacent sub-pixels sp are isolated, and the second electrodes 23 of adjacent sub-pixels sp are connected to form a common electrode. Optionally, the first electrode 21 is an anode, and the second electrode 23 is a cathode. The pixel layer 02 further includes a pixel definition layer 021, which has an opening K that exposes the first electrode 21, and the light-emitting layer 22 is deposited inside the opening K. One sub-pixel sp corresponds to one opening K, and the region where the opening K is located forms a light-emitting region Q of the sub-pixel sp. In FIG. 3, the region enclosed by the dashed circle at the position of the sub-pixel sp is the light-emitting region Q.

The drive layer 01 includes a first metal layer 011, a second metal layer 012, a third metal layer 013, a fourth metal layer 014, and a semiconductor layer 015. The first metal layer 011 is a metal layer closest to the pixel layer 02 in the drive layer 01. The first metal layer 011, the second metal layer 012, the third metal layer 013, the fourth metal layer 014, and the semiconductor layer 015 are sequentially arranged away from the pixel layer 02. In the pixel circuit 10, the active layer of the transistor is located in the semiconductor layer 015, the gate of each transistor is located in the fourth metal layer 014, and the first scanning line Scan1, the second scanning line Scan2, and the light-emitting control line Emit in the display panel are located in the fourth metal layer 014. The storage capacitor Cst has one electrode plate located in the fourth metal layer 014, and the other electrode plate located in the third metal layer 013. The first reset signal line Ref1 and the second reset signal line Ref2 are located in the third metal layer 013. The power signal line Pvdd is located in the second metal layer 012, and the data lines Data and the first signal line H are located in the first metal layer 011. Optionally, the first metal layer 011 and the second metal layer 012 are made of the same material, including titanium and aluminum. The third metal layer 013 and the fourth metal layer 014 are made of the same material, including molybdenum. An insulation layer between the first metal layer 011 and the second metal layer 012 is an organic insulation layer, such that the metal lines formed in the second metal layer 012 can be effectively covered by the organic insulation layer, avoiding the risk that metal lines are partially exposed and short-circuited with the metal lines in the first metal layer 011 above. This is because when the second metal layer 012 is a titanium/aluminum/titanium triple-layer structure, the metal lines in the second metal layer 012 are relatively thick, while the inorganic insulation layer is relatively thin, which may not completely cover the etching edge of the metal lines, leading to the risk of metal exposure. In addition, the organic insulation layer formed above the second metal layer 012 can also provide a flat surface, thereby avoiding the impact of metal lines fabricated in the second metal layer 012 on the flatness of the light-emitting region Q. Furthermore, the insulation layer between the first metal layer 011 and the pixel layer 02 is an organic insulation layer, and provides a flat surface above the first metal layer 011, such that the pixel layer 02 is formed on a substrate as flat as possible. The insulation layer between the second metal layer 012 and the third metal layer 013, the insulation layer between the third metal layer 013 and the fourth metal layer 014, and the insulation layer between the fourth metal layer 014 and the semiconductor layer 015 are all inorganic insulation layers.

It can be seen from FIG. 3 that the light-emitting region Q of each sub-pixel sp is located between adjacent data lines Data. In other words, the opening K of the pixel definition layer 021 corresponding to each sub-pixel sp is located between adjacent data lines Data. In addition, it can be seen from FIG. 3 that the first signal line H overlaps with the centers of the light-emitting regions Q of some sub-pixels sp. The center of the light-emitting region Q is construed as the geometric center of the shape of the light-emitting region Q.

In the embodiment of the present disclosure, the first metal layer 011 is the metal layer closest to the pixel layer 02 in the drive layer 01, and the data lines Data and the first signal line H are located in the first metal layer 011. By setting the data lines Data in the first metal layer 011, the spacing between the data lines Data and the signal lines (such as scanning lines and light-emitting control lines) that intersect with the data lines in the extending direction is increased, which is conducive to reducing the coupling capacitance between the data lines Data and the signal lines intersecting with the data lines, thereby reducing signal interference between them. Moreover, in the embodiment of the present disclosure, overlapping positions between the sub-pixels sp and the lines in the drive layer 01 are designed, and the light-emitting region Q of each sub-pixel sp is arranged between adjacent data lines Data. The data lines Data do not affect the flatness of the light-emitting regions Q of the sub-pixels sp, thus avoiding affecting the light emission of the light-emitting regions Q in all directions. In addition, since the first signal line H intersects with the centers of the light-emitting regions Q of some sub-pixels sp, the first signal line H makes the flatness of the light-emitting regions Q at both sides of the first signal line H basically the same. This can balance the brightness differences of the sub-pixels sp that overlap with the first signal line H under different viewing angles, thereby alleviating the four-directional color shift of the display panel and enhancing the display effect.

In the embodiment of the present disclosure, the data lines Data are arranged in the metal layer closest to the pixel layer 02 to reduce the signal interference between the data lines Data and the scanning lines. Moreover, the data lines Data has little impact on the flatness of the light-emitting regions Q of the sub-pixels sp. In addition, the first signal line H is arranged in the same layer as the data lines Data. The first signal line H overlaps with the centers of the light-emitting regions Q of some sub-pixels sp, and the first signal line H not only alleviates the four-directional color shift of the display panel, but also achieves reasonable utilization of the wiring space of the metal layer. This helps improve the compactness of the wiring space of the pixel circuit 10 and meet the wiring requirements of the display panel at high resolutions.

In addition, as shown in FIG. 5, the display panel further includes a first connection electrode 31 and a second connection electrode 32. The first connection electrode 31 is located in the first metal layer 011, and the second connection electrode 32 is located in the second metal layer 012. The first electrode 21 is connected to the pixel circuit through the first connection electrode 31 and the second connection electrode 32. The first electrode 21 of the sub-pixel sp is connected to the first connection electrode 31 through a via in the insulation layer. The first connection electrode 31 is connected to the second connection electrode 32 through a via, and the second connection electrode 32 is connected to the semiconductor layer 015 through a via. The first connection electrode 31 and the second connection electrode 32 can avoid the situation where the first electrode 21 is directly connected to the semiconductor layer 015 through a deep via. In the case of a deep via, a larger aperture is required to ensure electrical connectivity, which would result in more space occupied by the via, which is not conducive to the line routing of the display panel.

FIG. 5 also shows that the data line Data is connected to the semiconductor layer 015 through a first connection portion 33 located in the second metal layer 012. This design can also avoid an excessively large size of a via for connecting the data line Data to the data writing transistor in the pixel circuit 10.

Figure 6:
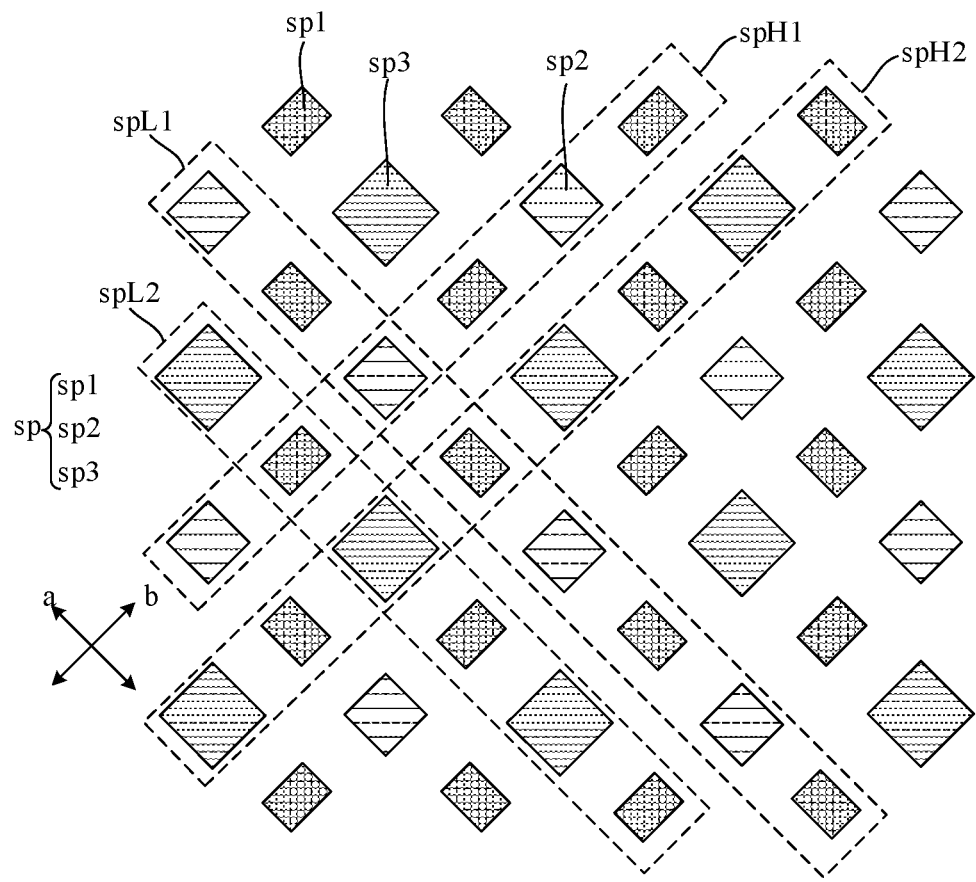
FIG. 6 is a schematic diagram of another display panel according to an embodiment of the present disclosure.

In some embodiments, FIG. 6 is a schematic diagram of another display panel according to an embodiment of the present disclosure, which shows an optional layout of sub-pixels sp in the display panel. As shown in FIG. 6, the plurality of sub-pixels sp in the display panel include first sub-pixels sp1, second sub-pixels sp2, and third sub-pixels sp3 emitting lights of different colors. The plurality of sub-pixels sp form a plurality of first pixel rows spH1 and a plurality of second pixel rows spH2 that are arranged alternately along a first direction a. The first pixel row spH1 is composed of the first sub-pixels sp1 and the second sub-pixels sp2 that are arranged alternately along a second direction b. The second pixel row spH2 is composed of the first sub-pixels sp1 and the third sub-pixels sp3 that are arranged alternately along the second direction b. The second direction b intersects with the first direction a. The sub-pixel arrangement in FIG. 3 is the same as that in FIG. 6. With reference to FIG. 3, the pixel circuits 10 in FIG. 3 are arranged along a row direction x to form pixel circuit rows, and the pixel circuit rows are arranged along a column direction y. The row direction x is not the same as the second direction b, and the column direction y is not the same as the first direction a. Any two of the first direction a, the second direction b, the row direction x, and the column direction y intersect with each other.

As shown in FIG. 6, the plurality of sub-pixels sp form a plurality of first pixel columns spL1 and a plurality of second pixel columns spL2 that are that are arranged alternately along the second direction b. The first pixel column spL1 is composed of the first sub-pixels sp1 and the second sub-pixels sp2 arranged alternately along the first direction a, while the second pixel column spL2 is composed of the first sub-pixels sp1 and the third sub-pixels sp3 arranged alternately along the first direction a.

Figure 7:
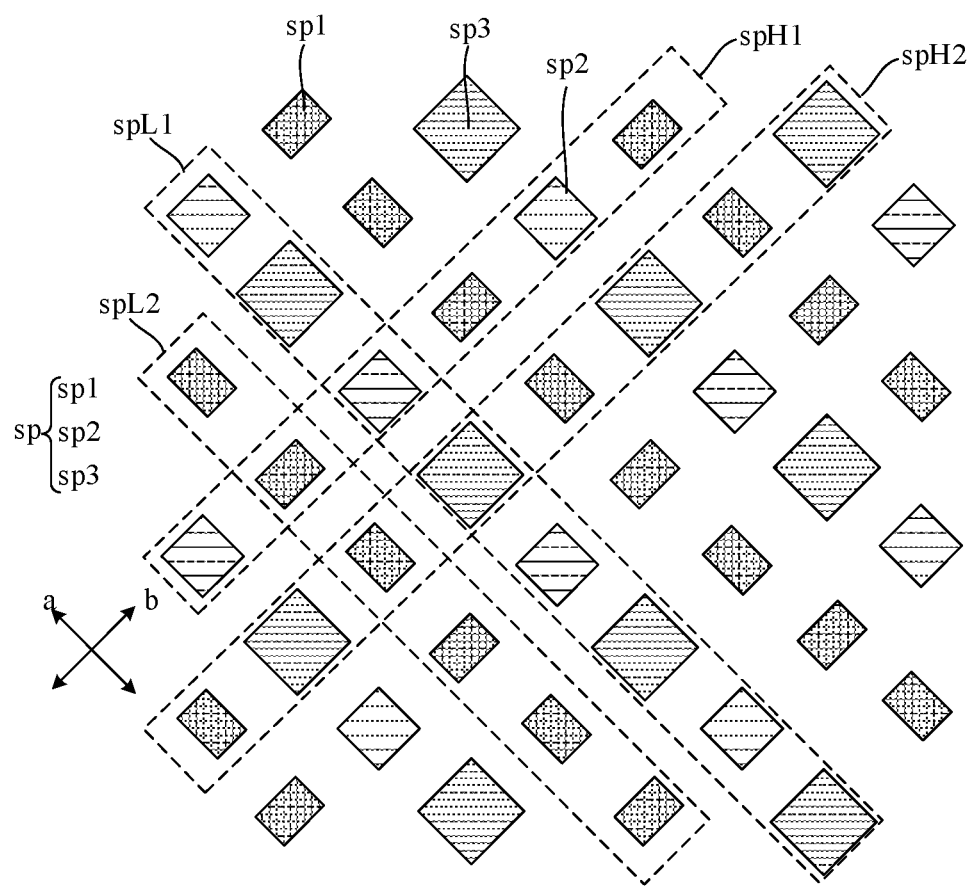
FIG. 7 is a schematic diagram of another display panel according to an embodiment of the present disclosure.

In other embodiments, FIG. 7 is a schematic diagram of another display panel according to an embodiment of the present disclosure, which shows another arrangement of the sub-pixels sp in the display panel. As shown in FIG. 7, the plurality of sub-pixels sp form a plurality of first pixel rows spH1 and a plurality of second pixel rows spH2 that are arranged alternately along the first direction a. The first pixel row spH1 is composed of the first sub-pixels sp1 and the second sub-pixels sp2 that are arranged alternately along the second direction b, while the second pixel row spH2 is composed of the first sub-pixels sp1 and the third sub-pixels sp3 that are arranged alternately along the second direction b. The second direction b intersects with the first direction a. The plurality of sub-pixels sp form a plurality of first pixel columns spL1 and a plurality of second pixel columns spL2 that are that are arranged alternately along the second direction b. The first pixel column spL1 is composed of the third sub-pixels sp3 and the second sub-pixels sp2 arranged alternately along the first direction a, while the second pixel column spL2 is composed of multiple first sub-pixels sp1 arranged along the first direction a.

The shape of each sub-pixel sp in the embodiments of the present disclosure is only illustrative and not intended to limit the present disclosure. Optionally, the first sub-pixel sp emits green light; one of the second sub-pixel sp2 and the third sub-pixel sp3 emits red light, while the other emits blue light.

In some embodiments, as shown in FIG. 3, one second sub-pixel sp2 overlaps with one drive transistor Tm, and one third sub-pixel sp3 overlaps with one drive transistor Tm. The first sub-pixel sp1 is located between two adjacent drive transistors Tm in the column direction y. The position of the drive transistor Tm in the pixel circuit 10 can be understood with reference to the illustration in FIG. 4. FIG. 3 shows that the pixel circuits 10 are arranged in the column direction y to form pixel circuit columns 10L, and four pixel circuit columns 10L are arranged along the row direction x. The first and third pixel circuit columns 10L overlap with the second sub-pixel sp2 and the third sub-pixel sp3, while the second and fourth pixel circuit columns 10L only overlap with the first sub-pixel sp1. In this embodiment, overlap positions between the sub-pixels sp and the pixel circuits 10 are designed, such that the second sub-pixel sp2 and the third sub-pixel sp3 are arranged between two adjacent data lines Data, and the first sub-pixel sp1 is arranged between two adjacent data lines Data. In this way, when the data lines Data are arranged in the first metal layer 01 closest to the pixel layer 02, mutual interference between the data lines Data and the scan lines can be reduced, while the data lines Data do not affect the flatness of the light-emitting region Q of each sub-pixel sp. Higher flexibility is achieved during design of the first signal line H or other conductive structures in the same layer as the data lines Data, such that the first signal line H overlaps with the center of the light-emitting region Q of the intersecting sub-pixel sp.

Figure 8:
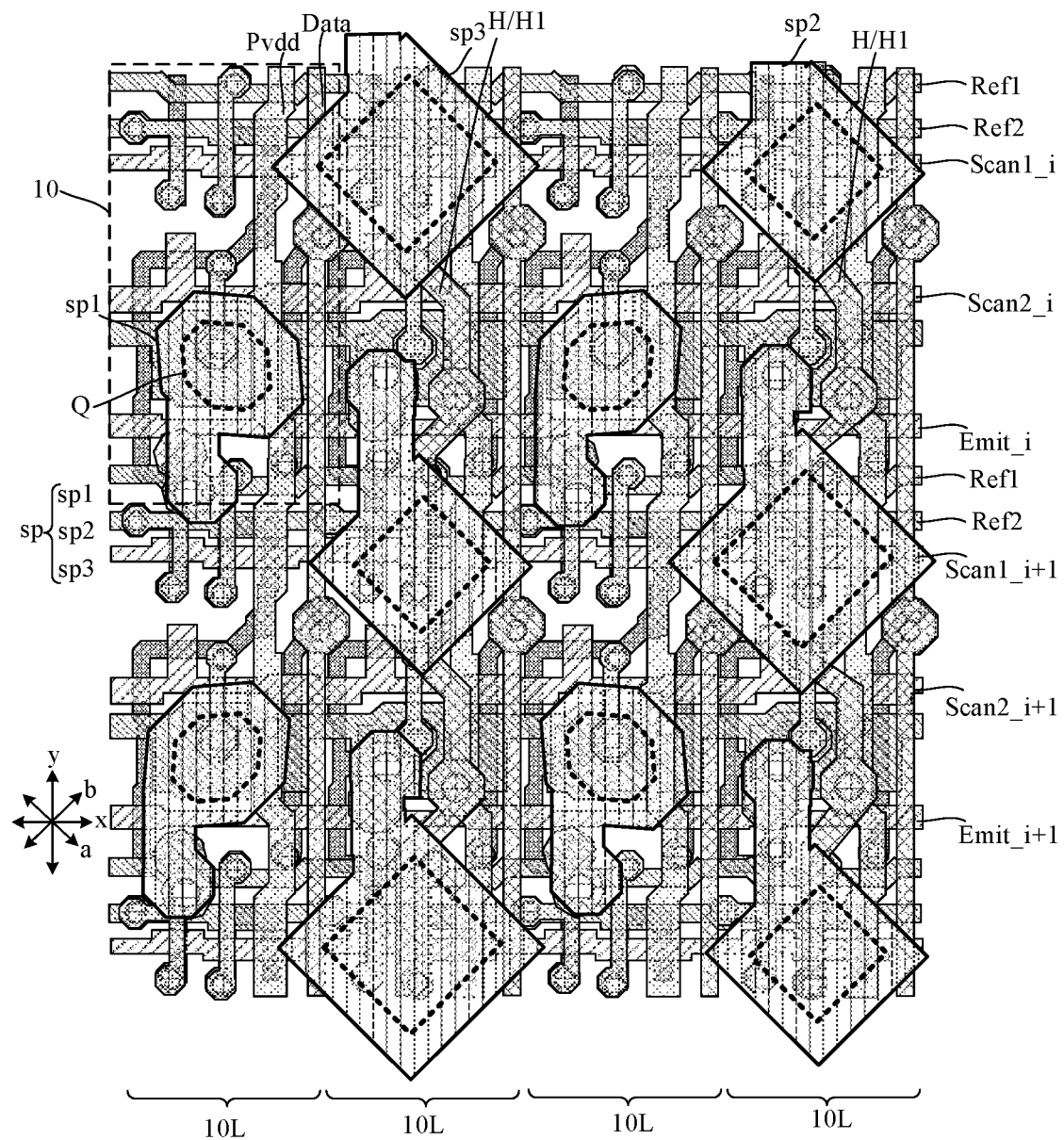
FIG. 8 is a schematic diagram of another display panel according to an embodiment of the present disclosure.

In other embodiments, FIG. 8 is a schematic diagram of another display panel according to an embodiment of the present disclosure. FIG. 8 also shows 8 pixel circuits 10 arranged in 2 rows (the i-th pixel circuit row and (i+1)-th pixel circuit row) and 4 columns, as well as the signal lines driving the two pixel circuit rows. The following embodiments shown in the figures, unless otherwise specified, also illustrate the i-th pixel circuit row and the (i+1)-th pixel circuit row as well as the signal lines driving the two pixel circuit rows, and the meaning of the same signs in the accompanying drawings can be understood with reference to the embodiment shown in FIG. 3.

In the embodiment shown in FIG. 8, both the data line Data and the first signal line H are located in the first metal layer 011. The arrangement of sub-pixels sp in FIG. 8 is the same as that in the embodiment shown in FIG. 6. As shown in FIG. 8, the light-emitting region Q of each sub-pixel sp is located between adjacent data lines Data, and the first signal line H overlaps with the centers of the light-emitting regions Q of some sub-pixels sp. One first sub-pixel sp1 overlaps with one drive transistor Tm, the second sub-pixel sp2 is located between two adjacent drive transistors Tm in the column direction y, and the third sub-pixel sp3 is also located between two adjacent drive transistors Tm in the column direction y. FIG. 8 also shows four pixel circuit columns 10L. It can be seen that the first and third pixel circuit columns 10L only overlap with the first sub-pixel sp1, while the second and fourth pixel circuit columns 10L overlap with the second sub-pixel sp2 and the third sub-pixel sp3. This embodiment can achieve that each sub-pixel sp is located between adjacent data lines Data. By setting the data lines Data in the first metal layer 01 closest to the pixel layer 02, the mutual interference between the data lines Data and the scanning lines can be reduced, and the data lines Data do not affect the flatness of the light-emitting region Q of each sub-pixel sp. Higher flexibility is achieved during design of the first signal line H or other conductive structures in the same layer as the data lines Data, such that the first signal line H overlaps with the center of the light-emitting region Q of the intersecting sub-pixel sp.

In the embodiment of the present disclosure, the sub-pixel sp includes a patterned first electrode 21, that is, the first electrodes 21 of adjacent sub-pixels sp are isolated from each other. The patterned sub-pixel sp illustrated in FIG. 3 and FIG. 8 can be regarded as the shape of the first electrode 21. The first electrode 21 has an area larger than that of the light-emitting region Q. The first electrode 21 of the first sub-pixel sp1 does not overlap with the data line Data. Optionally, if the first sub-pixel sp1 emits green light, the green light emitted by the first sub-pixel sp1 accounts for a lowest proportion in white light generated by the combination of the first sub-pixel sp1, the second sub-pixel sp2 and the third sub-pixel sp3. The area of the first sub-pixel sp can be set relatively small to ensure that the first electrode 21 of the first sub-pixel sp1 does not overlap with the data line Data.

In some embodiments, the display panel further includes a second signal line. The first signal line H and the second signal line are electrically connected through a first via, and transmit the same constant voltage signal. The first signal line H can reduce the voltage drop during transmission of the constant voltage signal, improve the in-plane uniformity, and enhance the display effect. Optionally, the second signal line can transmit a power signal or reset signal.

In the embodiment shown in FIG. 3, the second signal line transmitting a power signal is taken as an example. As shown in FIG. 3, the second signal line X2 is a power signal line Pvdd. The second signal line X2 and the first signal line H extend along the same direction, which is the column direction y. The layer structure of the display panel in this embodiment can be understood with reference to the embodiment shown in FIG. 5. As can be seen from FIG. 5, the second metal layer 012 is located at a side of the first metal layer 011 close to the substrate 00, and the second signal line X2 is located in the second metal layer 012.

Figure 9:
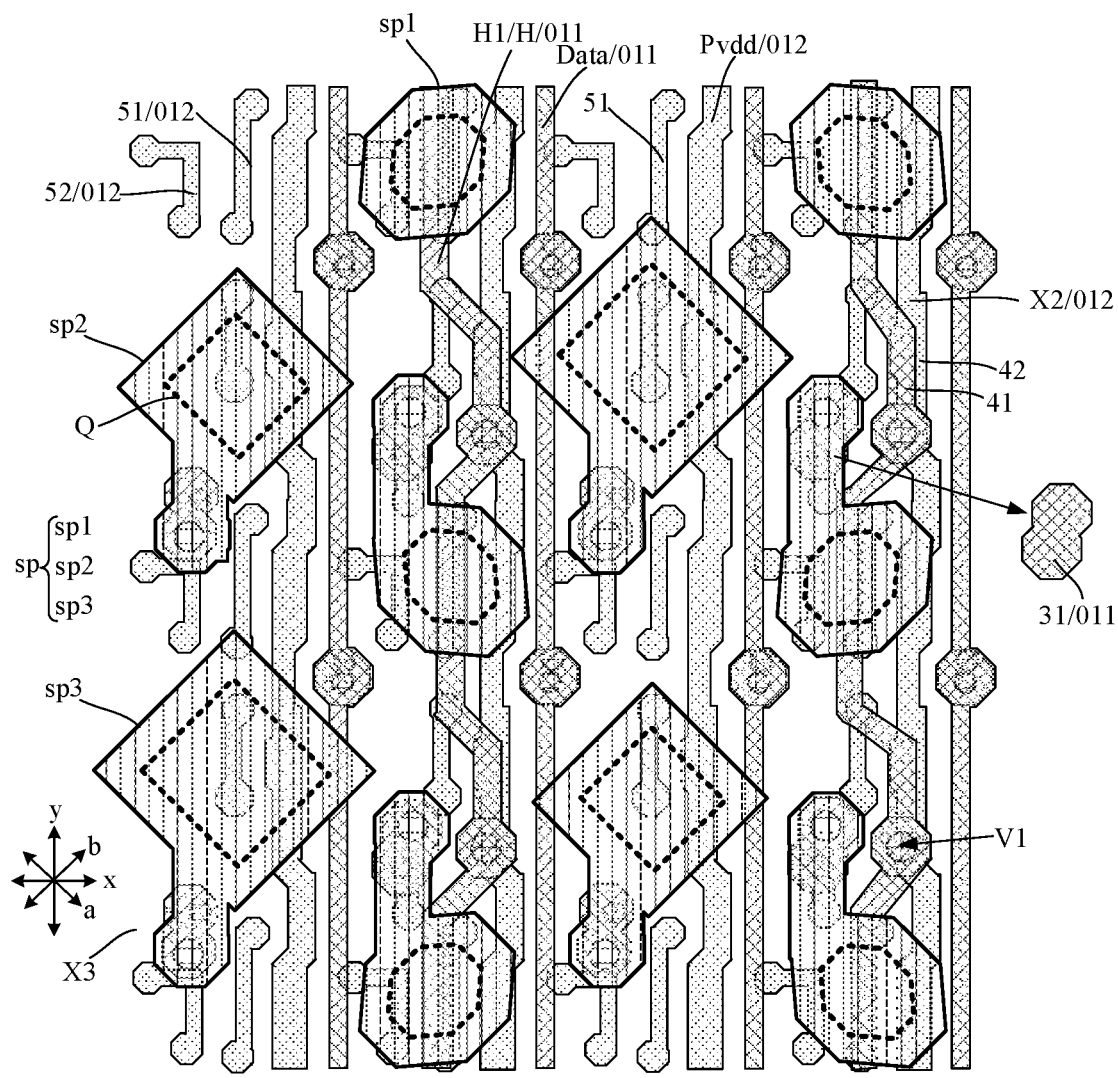
FIG. 9 is a simplified schematic diagram of the display panel according to the embodiment shown in FIG. 3.

FIG. 9 is a simplified schematic diagram of the display panel according to the embodiment shown in FIG. 3. In order to more clearly illustrate the overlapping relationship among the first signal line H, the second signal line X2, and the sub-pixel sp, as well as the relative positions of the sub-pixel sp and the data line Data, only the metal lines in the first metal layer 011 and the second metal layer 012, and the sub-pixels sp in the display panel are illustrated in FIG. 9.

Both FIG. 3 and FIG. 9 show the position of the first via V1. The first signal line H and the second signal line X2 are electrically connected through the first via V1, and the first via V1 does not overlap with the sub-pixel sp. In the embodiment of the present disclosure, the first signal line H overlaps with the sub-pixel sp, and the first signal line H is located in the metal layer closest to the pixel layer 02. The second signal line X2 is located below the first signal line H, and the first signal line H and the second signal line X2 are electrically connected through the first via V1. An insulation layer between the first metal layer 011 where the first signal line H is located and the second metal layer 012 where the second signal line X2 is located is an organic insulation layer, and the organic insulation layer is relatively thick, which makes the depth and area of the first via V1 large. The first via V1 does not overlap with the sub-pixel sp, which can avoid the first via V1 from affecting the flatness of the light-emitting region Q of the sub-pixel sp.

Figure 10:
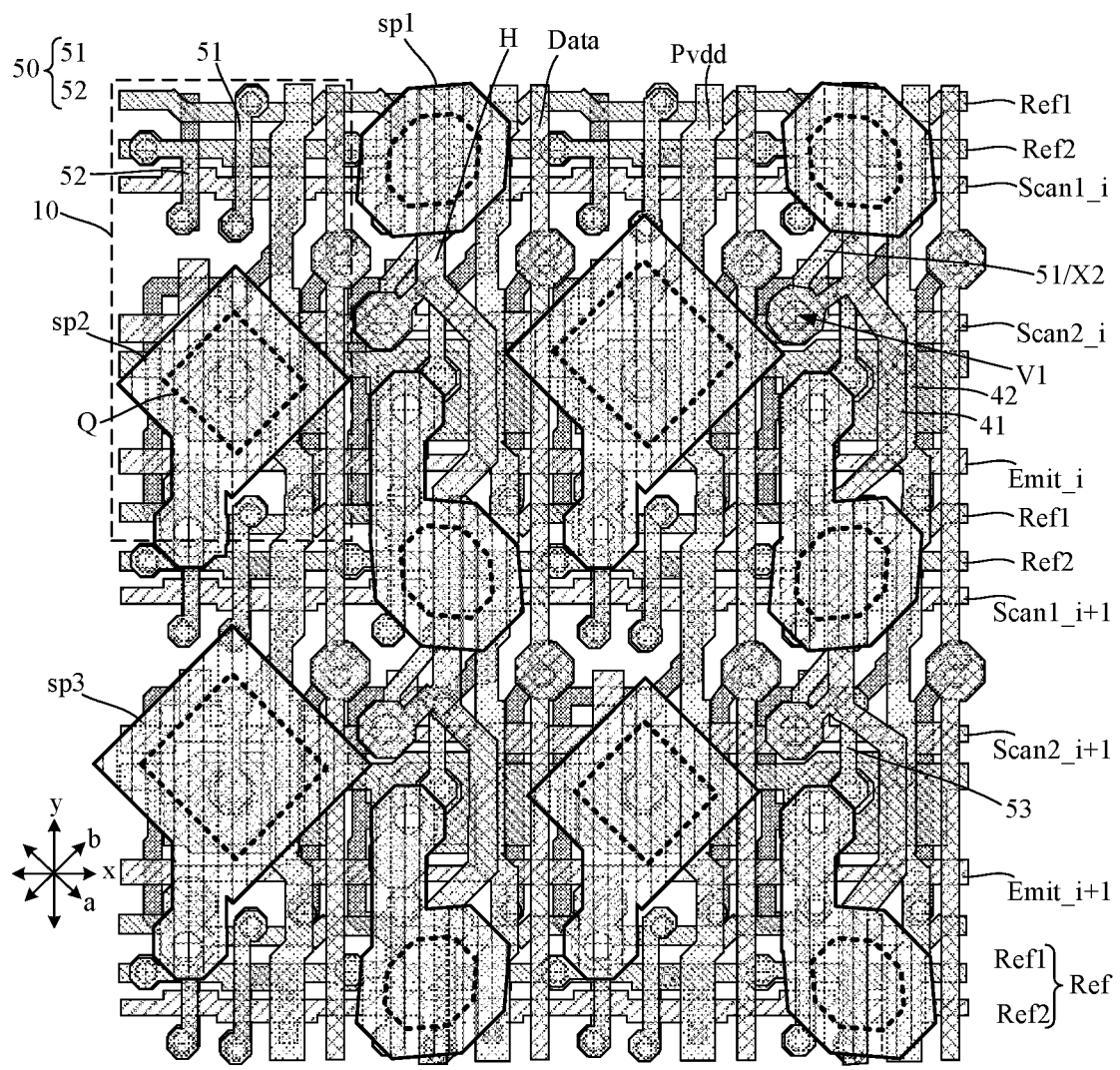
FIG. 10 is a schematic diagram of another display panel according to an embodiment of the present disclosure.
Figure 11:
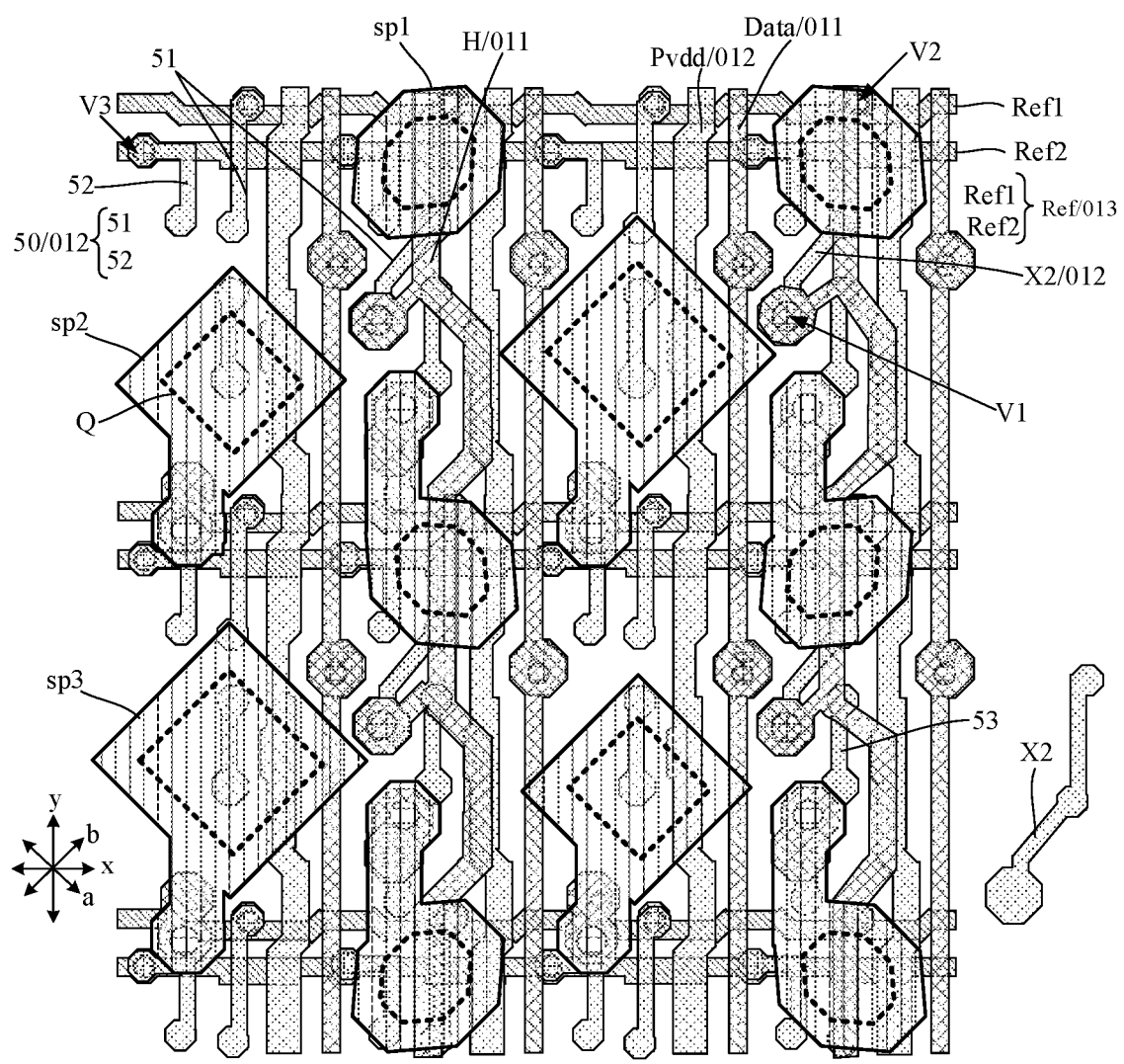
FIG. 11 is a simplified schematic diagram of the display panel according to the embodiment shown in FIG. 10.

In other embodiments, the second signal line transmits a reset signal, and the first via connecting the first signal line H and the second signal line do not overlap with the sub-pixel sp. FIG. 10 is a schematic diagram of another display panel according to an embodiment of the present disclosure, and FIG. 11 is a simplified schematic diagram of the display panel according to the embodiment shown in FIG. 10. In order to more clearly illustrate the overlapping relationship among the first signal line H, the second signal line X2, and the sub-pixel sp, as well as the relative positions of the sub-pixel sp and the data line Data, only the metal lines in the first metal layer 011 and the second metal layer 012, some metal lines in the third metal layer 013, and the sub-pixels sp in the display panel are illustrated in FIG. 11. Referring to FIG. 10 and FIG. 11, the display panel further includes a reset signal line Ref, and the reset signal line Ref includes a first reset signal line Ref1 and a second reset signal line Ref2. An extension direction of the reset signal line Ref intersects with the extension direction of the data line Data. Both the first reset signal line Ref1 and the second reset signal line Ref2 are located in the third metal layer 013. A reset connection line 50 is provided in the second metal layer 012. The reset connection line 50 includes a first reset connection line 51 and a second reset connection line 52. The first reset connection line 51 is electrically connected between the first reset signal line Ref1 and the gate reset transistor M3, and the second reset connection line 52 is electrically connected between the second reset signal line Ref2 and the electrode reset transistor M2. FIG. 11 shows that the first reset connection line 51 is electrically connected to the first reset signal line Ref1 through a second via V2, and the second reset connection line 52 is electrically connected to the second reset signal line Ref2 through a third via V3. In this embodiment, the second signal line X2 is the first reset connection line 51, and the first signal line H is electrically connected to the first reset connection line 51 through the first via V1. The first via V1 does not overlap with the sub-pixel sp, thereby avoiding the impact of the first via V1 on the flatness of the light-emitting region Q of the sub-pixel sp.

Referring to FIG. 3 and FIG. 5, the first metal layer 011 includes a first connection electrode 31. That is, the first connection electrode 31 is in the same layer as the first signal line H. The pixel circuit 10 is electrically connected to the first electrode 21 through the first connection electrode 31. FIG. 3 shows the position of the first connection electrode 31, and the first connection electrode 31 has a patterned structure. The first signal line H includes a first segment 41, and at least a part of the first segment 41 bypasses the first connection electrode 31 from one side of the first connection electrode 31 in the plan view. In this embodiment, an output terminal of the pixel circuit 10 (i.e., the terminal that needs to be connected with the first electrode 21) is located in the semiconductor layer 015. The semiconductor layer 015 is far from the layer where the first electrode 21 is located. In order to ensure the electrical connectivity between the pixel circuit 10 and the first electrode 21, the first connection electrode 31 is provided in the first metal layer 011. The first connection electrode 31 is in the same layer as the first signal line H and the data lines Data, and the first connection electrode 31 is located between adjacent data lines Data. In the embodiment of the present disclosure, the light-emitting region Q of the sub-pixel sp is located between adjacent data lines Data, and the first signal line H overlaps with the center of the light-emitting region Q, indicating that the first signal line H is also located between adjacent data lines Data. In addition, a first connection electrode 31 is also located in the area between the two adjacent data lines Data where the first signal line H is located. At least a part of the first segment 41 passes around the first connection electrode 31 from one side of the first connection electrode 31 in the plan view. The position and shape of the first signal line H are designed, and the wiring space of the first metal layer 011 is used rationally to ensure mutual insulation between the first signal line H and the first connection electrode 31, which is also conducive to the compact arrangement of the wiring in the first metal layer 011, and can meet the wiring requirements of high pixel density (such as a display panel with a resolution of 1920*1080) and even ultra-high pixel density (such as a display panel with a resolution of 2560×1440).

In some embodiments, as shown in FIG. 3 and FIG. 10, the first segment 41 of the first signal line H at least partially overlaps with the storage capacitor Cst. For the position of the storage capacitor Cst, reference can be made to the illustration in FIG. 4. The power signal line Pvdd includes a second segment 42. The second segment 42 at least partially overlaps with the storage capacitor Cst, and at least partially overlaps with the first segment 41. The first segment 41 of the first signal line H bypasses the first connection electrode 31 from one side of the first connection electrode 31 to ensure mutual insulation between the first segment 41 and the first connection electrode 31 in the same layer. The first segment 41 avoids the first connection electrode 31 and is designed to partially overlap with the second segment 42, which can save the wiring space of the display panel. The first signal line H is arranged in the same layer as the data line Data, which does not affect the wiring space, and is conducive to meeting the wiring requirements of high pixel density or even ultra-high pixel density.

In some embodiments, as shown in FIG. 3, the second signal line X2 includes a power signal line Pvdd. The first segment 41 of the first signal line H at least partially overlaps with the storage capacitor Cst, and the second segment 42 of the power signal line Pvdd at least partially overlaps with the storage capacitor Cst. The first segment 41 and the second segment 42 are connected through the first via V1 at the overlapping position, such that the first via V1 connected between the first signal line H and the second signal line X2 overlaps partially with the storage capacitor Cst. At the overlapping position of the first segment 41 and the second segment 42, there is enough space to set a relatively large first via V1. The first via V1 does not overlap with the sub-pixel sp and does not affect the area occupied by the pixel circuit 10. This is advantageous for meeting the wiring requirements of high pixel density and even ultra-high pixel density.

In other embodiments, as shown in FIG. 10 and FIG. 11, the second signal line X2 includes a first reset connection line 51. The display panel further includes a node connection line 53 located in the second metal layer 012. The node connection line 53 is electrically connected to the gate of the drive transistor Tm and the gate reset transistor M3. The node connection line 53 is in the same layer as the second signal line X2. The first via V1 connecting the first signal line H and the second signal line X2 is located between the node connection line 53 and the data line Data. In this embodiment, there is enough space between the node connection line 53 and the data line Data to set a relatively large first via V1, such that the first via V1 does not overlap with the sub-pixel sp and does not affect the area occupied by the pixel circuit 10. This is advantageous for meeting the wiring requirements of high pixel density and even ultra-high pixel density.

In the embodiment shown in FIG. 10, the second signal line X2 includes a first reset connection line 51. That is, the first signal line H is connected to the first reset signal line Ref1 through the first reset connection line 51. The first signal line H transmits a first reset signal. The first signal line H can reduce the voltage drop during transmission of the first reset signal, improve the uniformity of the first reset signal in the entire display panel, and thus improve the display uniformity. In other embodiments, the second signal line X2 includes a second reset connection line 52. That is, the first signal line H is connected to the second reset signal line Ref2 through the second reset connection line 52. The first signal line H transmits a second reset signal. The first signal line H can reduce the voltage drop during transmission of the second reset signal, improve the uniformity of the second reset signal in the entire display panel, and thus improve the display uniformity.

Figure 12:
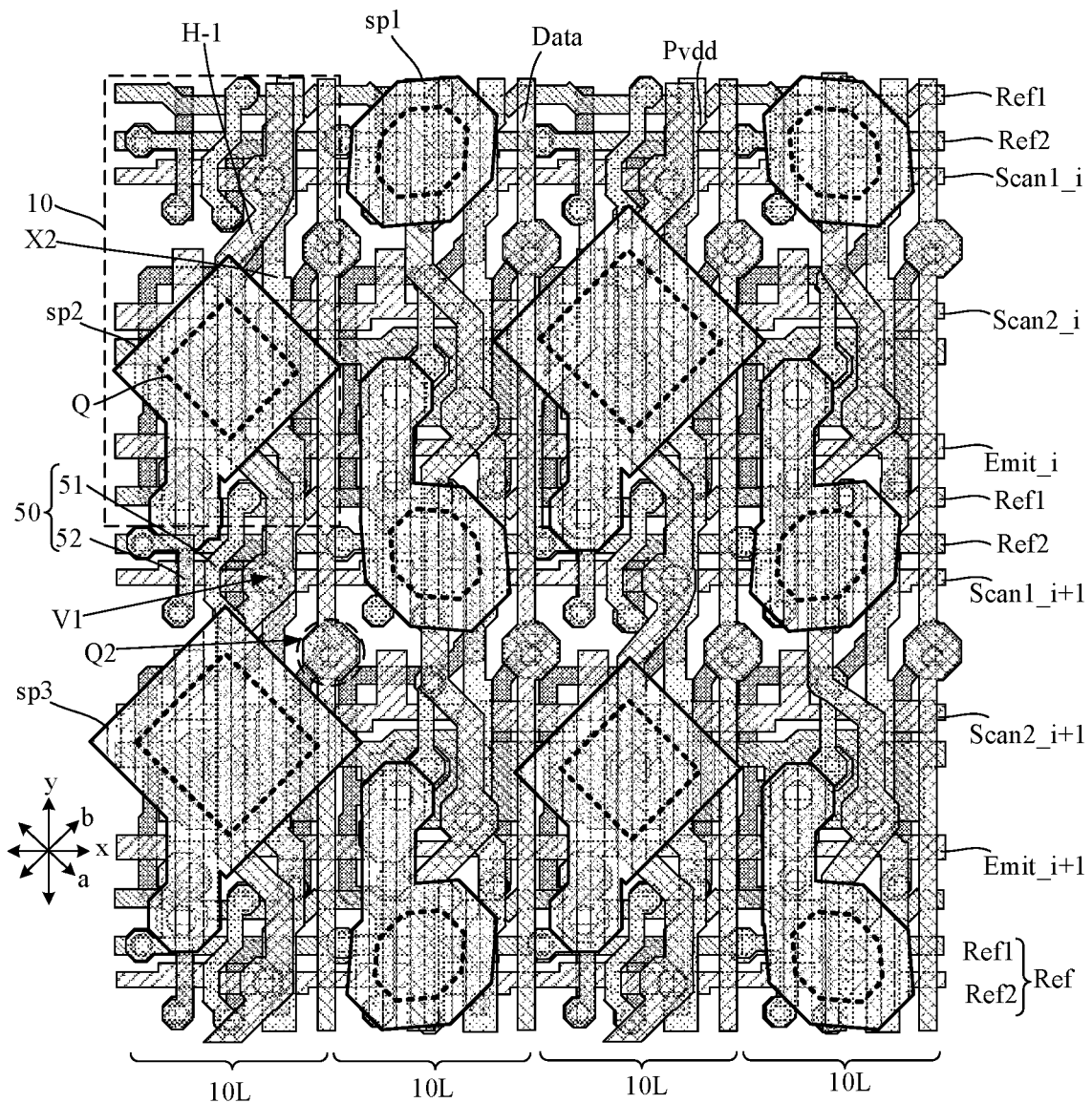
FIG. 12 is a schematic diagram of another display panel according to an embodiment of the present disclosure.
Figure 13:
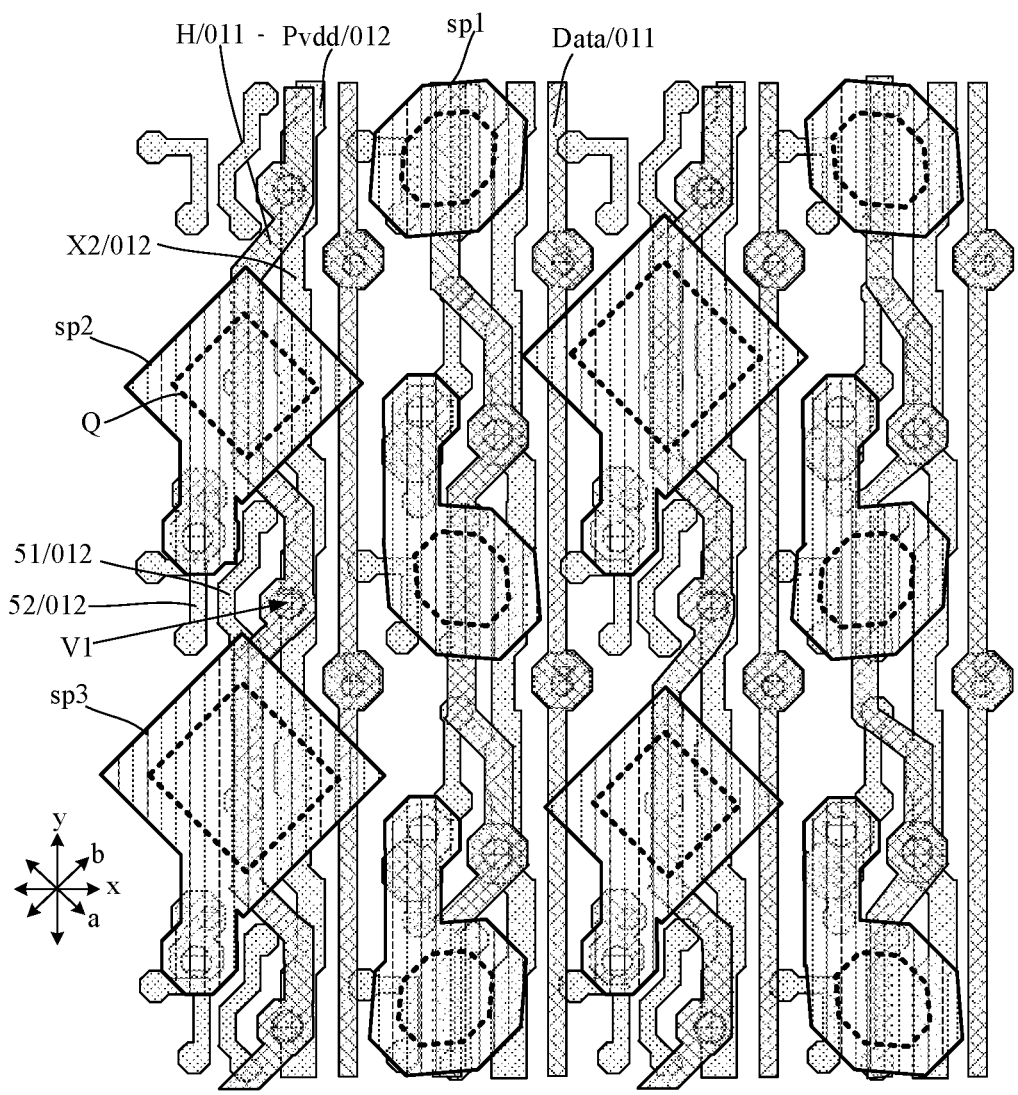
FIG. 13 is a simplified schematic diagram of the display panel according to the embodiment shown in FIG. 12.

In other embodiments, FIG. 12 is a schematic diagram of another display panel according to an embodiment of the present disclosure, and FIG. 13 is a simplified schematic diagram of the display panel according to the embodiment shown in FIG. 12. FIG. 13 only shows the metal lines in the first metal layer 011 and the second metal layer 012, as well as the sub-pixels sp in the display panel. Referring to FIG. 12 and FIG. 13, the display panel includes a reset connection line 50 located in the second metal layer 012. The reset connection line 50 is electrically connected between the reset signal line Ref and the reset transistor. The reset connection line 50 includes a first reset connection line 51 and a second reset connection line 52. The first reset connection line 51 is electrically connected between the first reset signal line Ref1 and the gate reset transistor M3. The second reset connection line 52 is electrically connected between the second reset signal line Ref2 and the electrode reset transistor M2.

FIG. 12 shows four pixel circuit columns 10L. At the position of the first pixel circuit column 10L from the left in FIG. 12, the first via V1 connecting the first signal line H-1 and the second signal line X2 is located between the first reset connection line 51 and the data line Data. The first reset connection line 51 bypasses the first via V1 from a side of the first via V1, and the second signal line X2 is a power signal line Pvdd. FIG. 12 also shows a via region Q2 where the data line Data is connected to the data writing transistor in the pixel circuit 10. The first signal line H-1 and the data line Data are located in the same layer, and the first reset connection line 51 and the second signal line X2 are located in the same layer. To avoid the first via V1 from affecting the via region Q2, the line shape of the first reset connection line 51 is designed in this embodiment to ensure that there is enough space between the first reset connection line 51 and the data line Data to set the first via V1. In this way, the first via V1 does not overlap with the sub-pixel sp, avoiding the impact of the first via V1 on the flatness of the light-emitting region Q of the sub-pixel sp.

In some embodiments, as shown in FIG. 3 and FIG. 9, the first signal line H includes a first signal sub-line H1, and the second signal line X2 is a power signal line Pvdd. The first signal sub-line H1 is electrically connected to the power signal line Pvdd through the first via V1, and it transmits a power voltage signal. At least one of segments of the second signal line X2 overlaps with the sub-pixel sp. At the sub-pixel sp that overlaps with both the first signal sub-line H1 and the second signal line X2, the second signal line X2 does not overlap with the first signal sub-line H1. In this embodiment, the via connection between the first signal sub-line H1 and the power signal line Pvdd can reduce the voltage drop during transmission of the power signal, and improve the uniformity of the power signal in the entire display panel. At the sub-pixel sp overlaps with both the first signal sub-line H1 and the second signal line X2, the second signal line X2 does not overlap with the first signal sub-line H1, which can enable the first signal sub-line H1 to overlap with the center of the light-emitting region Q of the sub-pixel sp without changing the wiring method in the layer where the second signal line X2 is located. At the position where the first signal sub-line H1 overlaps with the sub-pixel sp, the flatness of the light-emitting region Q at both sides of the first signal sub-line H1 is basically the same. This can balance the brightness differences of the sub-pixels sp overlapping with the first signal sub-line H1 from different viewing angles, thereby alleviating the four-directional color shift of the display panel and enhancing the display effect.

In some embodiments, as shown in FIG. 3, the display panel includes a reset connection line 50, which is electrically connected between the reset signal line and the reset transistor. The reset connection line 50 is located in the second metal layer 012. The reset connection line 50 includes a first reset connection line 51 and a second reset connection line 52. The first reset connection line 51 is electrically connected between the first reset signal line Ref1 and the gate reset transistor M3, and the second reset connection line 52 is electrically connected between the second reset signal line Ref2 and the electrode reset transistor M2. Both the first reset signal line Ref1 and the second reset signal line Ref2 are located in the third metal layer 013.

With reference to FIG. 3 and FIG. 9, at the sub-pixel sp overlaps with both the first signal sub-line H1 and the second signal line X2, the first reset connection line 51 overlaps with the first signal sub-line H1. In this embodiment, the shape of the first signal sub-line H1 is designed, such that the first signal sub-line H1 overlaps with the center of the light-emitting region Q of the sub-pixel sp. During placing and routing of the first signal sub-line H1 under the light-emitting region Q, there is no need to change the placing and routing method in the second metal layer 012. The first signal sub-line H1 overlaps with the first reset connection line 51, which can ensure the tightness of the layout in the panel. The first signal sub-line H1 does not occupy extra layout space, which is conducive to meeting the layout requirements of high pixel density or even ultra-high pixel density.

In some embodiments, as shown in FIG. 3, a plurality of pixel circuits 10 define a plurality of pixel circuit columns 10L arranged along a third direction x, and each pixel circuit column 10L includes multiple pixel circuits 10 arranged along a fourth direction y. The third direction x intersects with the fourth direction y. FIG. 3 shows four pixel circuit columns 10L, where the row direction x is the third direction and the column direction y is the fourth direction. The data line Data and the first signal line H extend along the fourth direction y. The first signal line H includes first signal sub-lines H1, and every two adjacent first signal sub-lines H1 are spaced apart by one pixel circuit column 10L. In other words, the first signal sub-lines H1 are arranged with being spaced from one another by one pixel circuit column. In this embodiment, the first signal sub-line H1 overlaps with the center of the light-emitting region Q of the sub-pixel sp, which can balance the brightness differences of the sub-pixels sp overlapping with the first signal line H under different viewing angles, thereby improving the four-directional color shift of the display panel and enhancing the display effect. On the basis of the arrangement of the sub-pixels sp, the first signal sub-lines H1 are arranged with being spaced from one another by one pixel circuit column, which can make the sub-pixels sp overlapping with the first signal sub-lines H1 have the same color. This can make the performance of the sub-pixels sp overlapping with the first signal sub-lines H1 basically the same, thus enhancing the display uniformity. For example, as shown in FIG. 3, all the first signal sub-lines H1 overlap with the first sub-pixels sp1. In the embodiment shown in FIG. 8, each first signal sub-lines H1 overlap with both the second sub-pixel sp2 and the third sub-pixel sp3.

Figure 14:
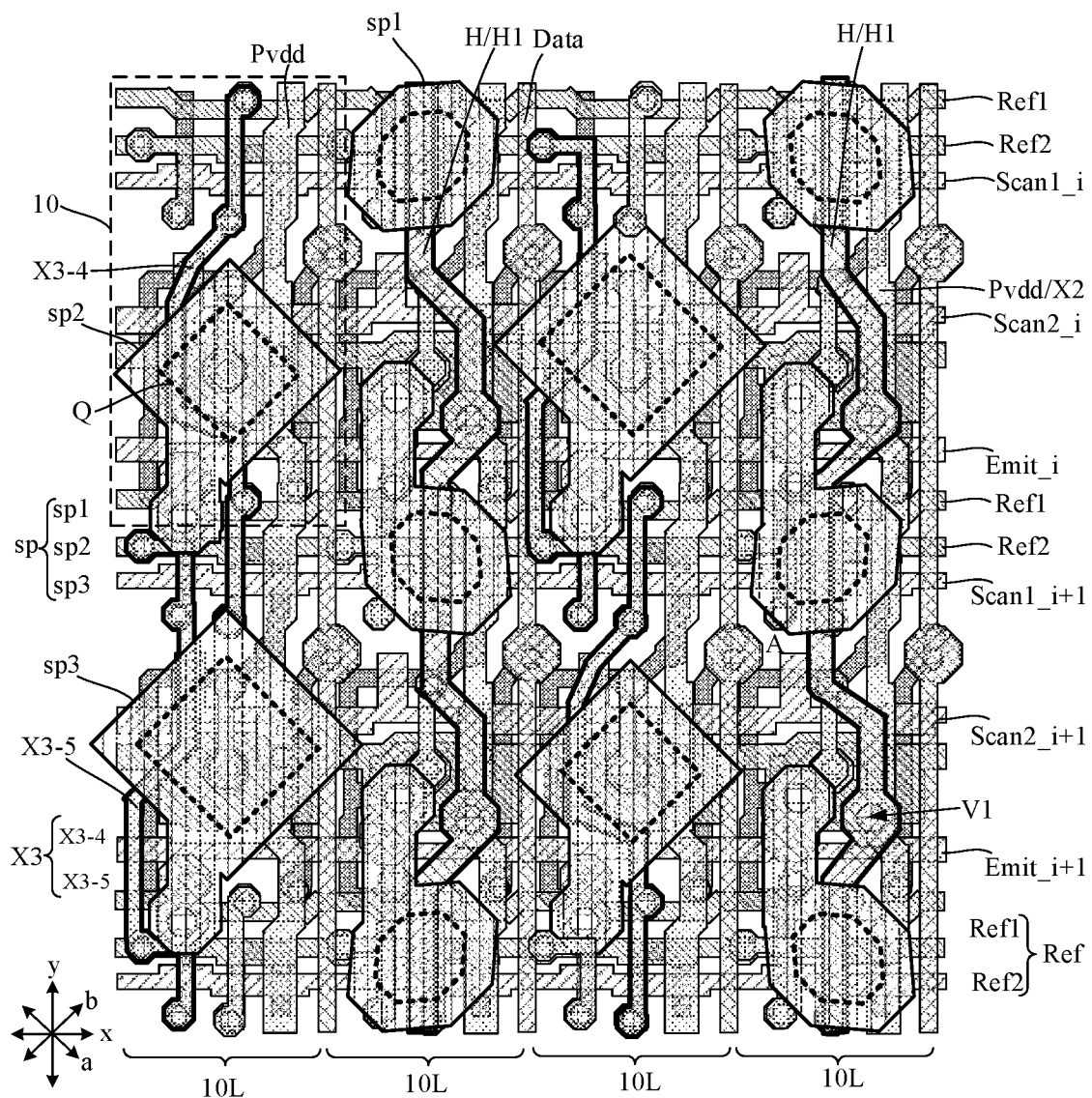
FIG. 14 is a schematic diagram of another display panel according to an embodiment of the present disclosure.

In some embodiments, FIG. 14 is a schematic diagram of another display panel according to an embodiment of the present disclosure. As shown in FIG. 14, the display panel further includes third signal lines X3, which is electrically connected to the reset signal line Ref. The first signal sub-line H1 is electrically connected to the power signal line Pvdd through the first via V1, and the third signal line X3 is located in the second metal layer 012, i.e., the third signal line X3 and the first signal sub-line H1 are located in different layers. Two adjacent third signal lines X3 in the third direction x are spaced apart by one pixel circuit column 10L. The third signal line X3 and the first signal sub-line H1 are located in different pixel circuit columns 10L. The first signal sub-lines H1 and the third signal lines X3 are arranged alternately along the third direction x. In this embodiment, the first signal sub-line H1 and the power signal line Pvdd intersect with each other and are electrically connected, which can reduce the voltage drop during transmission of the power signal and improve the uniformity of the power signal in the entire panel. The third signal line X3 and the reset signal line intersect with each other and are electrically connected, which can reduce the voltage drop during transmission of the reset signal and improve the uniformity of the reset signal in the entire panel, thus promoting the display uniformity. The first signal sub-line H1 is located in the first metal layer 011 and overlaps with the center of the light-emitting region Q of the sub-pixel sp. This can balance the brightness differences of the sub-pixels sp overlapping with the first signal line H at different viewing angles, thus alleviating the four-directional color shift of the display panel. In addition, the third signal lines X3 are located in the second metal layer 012. The third signal lines X3 and the first signal sub-lines H1 are located in different pixel circuit columns 10L and are arranged alternately along the third direction x. This can save the wiring space of the display panel and meet the requirements of wiring of the high-resolution display panel.

In order to more clearly illustrate the third signal line X3 and the first signal sub-line H1, these two lines are bolded in FIG. 14. The bolded lines in the accompanying drawings of the following embodiments are also used to more clearly illustrate the corresponding signal lines.

Figure 15:
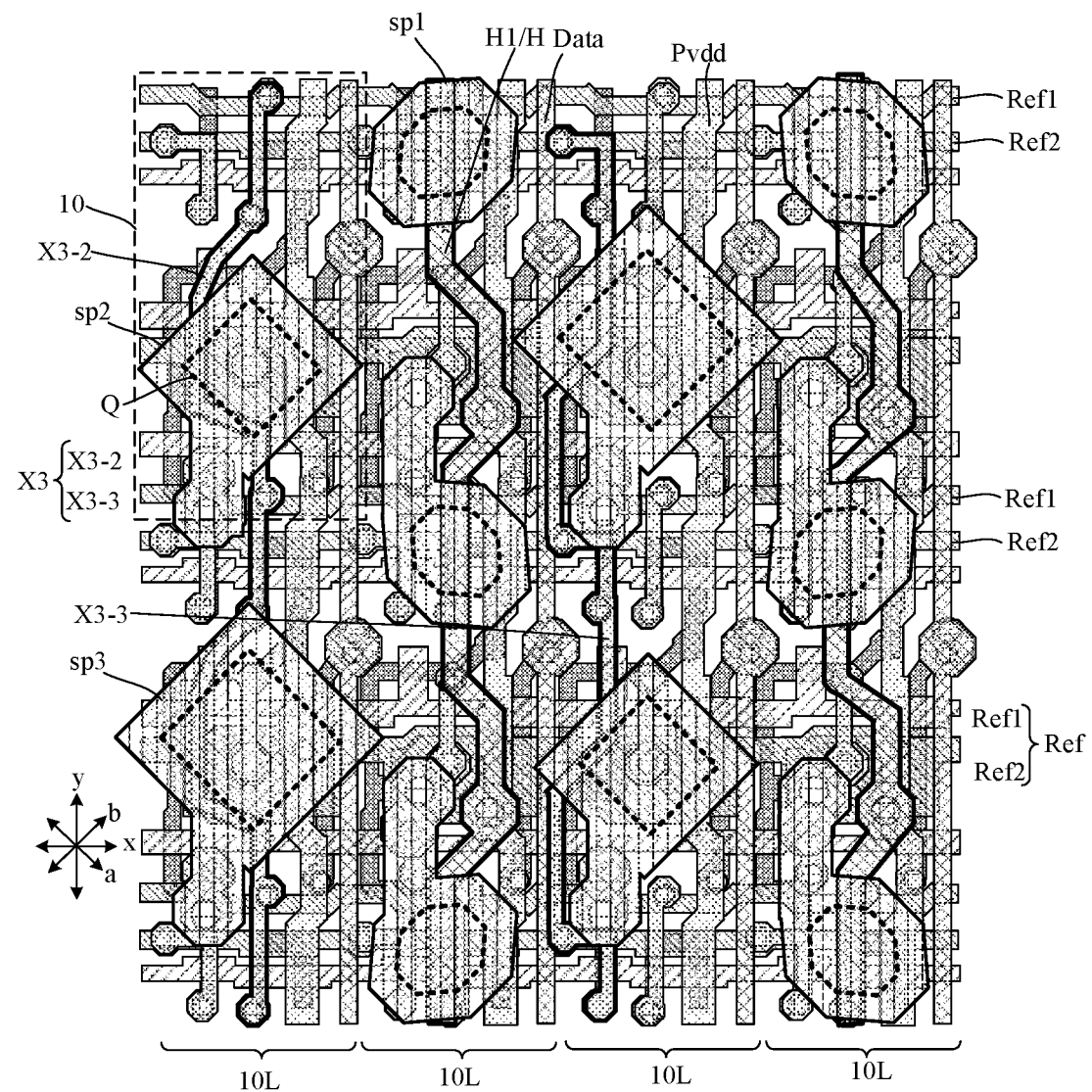
FIG. 15 is a schematic diagram of another display panel according to an embodiment of the present disclosure.

In some embodiments, FIG. 15 is a schematic diagram of another display panel according to an embodiment of the present disclosure. As shown in FIG. 15, the reset signal line Ref includes a first reset signal line Ref1 and a second reset signal line Ref2. Voltage values of signals transmitted by the first reset signal line Ref1 and the second reset signal line Ref2 are different. The third signal line X3 includes a second signal sub-line X3-2 and a third signal sub-line X3-3. The second signal sub-line X3-2 is electrically connected to the first reset signal line Ref1, and the third signal sub-line X3-3 is electrically connected to the second reset signal line Ref2. The second signal sub-line X3-2 overlaps with one pixel circuit column 10L, and the third signal sub-line X3-3 overlaps with one pixel circuit column 10L. In this embodiment, the first reset signal line Ref1 and the second reset signal line Ref2 are provided. A higher reset voltage is provided to the gate of the drive transistor Tm through the first reset signal line Ref1, to achieve faster threshold capture at the gate of the drive transistor Tm. In the application to the high-frequency display or low-brightness (or gray-scale) display, the threshold capture time of the gate of the drive transistor Tm is shorter. With faster threshold capture at the gate of the drive transistor Tm, the captured threshold is more accurate, thus reducing display unevenness. At the same time, a lower reset voltage is provided to the electrode of the light-emitting element PD through the second reset signal line Ref2 to alleviate the problem of the light-emitting element PD being covertly-lightened, thus improving the low gray-scale display effect. The third signal line X3 includes the second signal sub-line X3-2 and the third signal sub-line X3-3, which can reduce the voltage drop during transmission of the first reset signal and the second reset signal, and improve the in-plane uniformity.

In some embodiments, as shown in FIG. 14, the third signal line X3 includes a fourth signal sub-line X3-4 and a fifth signal sub-line X3-5. The fourth signal sub-line X3-4 is electrically connected to the first reset signal line Ref1, and the fifth signal sub-line X3-5 is electrically connected to the second reset signal line Ref2. One fourth signal sub-line X3-4 overlaps with one sub-pixel sp, and one fifth signal sub-line X3-5 overlaps with one sub-pixel sp. Corresponding to one pixel circuit column 10L, the fourth signal sub-lines X3-4 and the fifth signal sub-lines X3-5 are arranged alternately along the fourth direction y. The sub-pixels sp overlapping with the first signal sub-lines H1 are all first sub-pixels sp, the sub-pixels sp overlapping with the fourth signal sub-lines X3-4 are all second sub-pixels sp, and the sub-pixels sp overlapping with the fifth signal sub-lines X3-5 are all third sub-pixels sp. In this embodiment, each first signal sub-line H1 overlaps with sub-pixels sp of the same color, each fourth signal sub-line X3-4 overlaps with sub-pixels sp of the same color, and each fifth signal sub-line X3-5 overlaps with sub-pixels sp of the same color, which is conducive to making the performance of sub-pixels sp of the same color basically the same, thereby improving the display uniformity.

Figure 16:
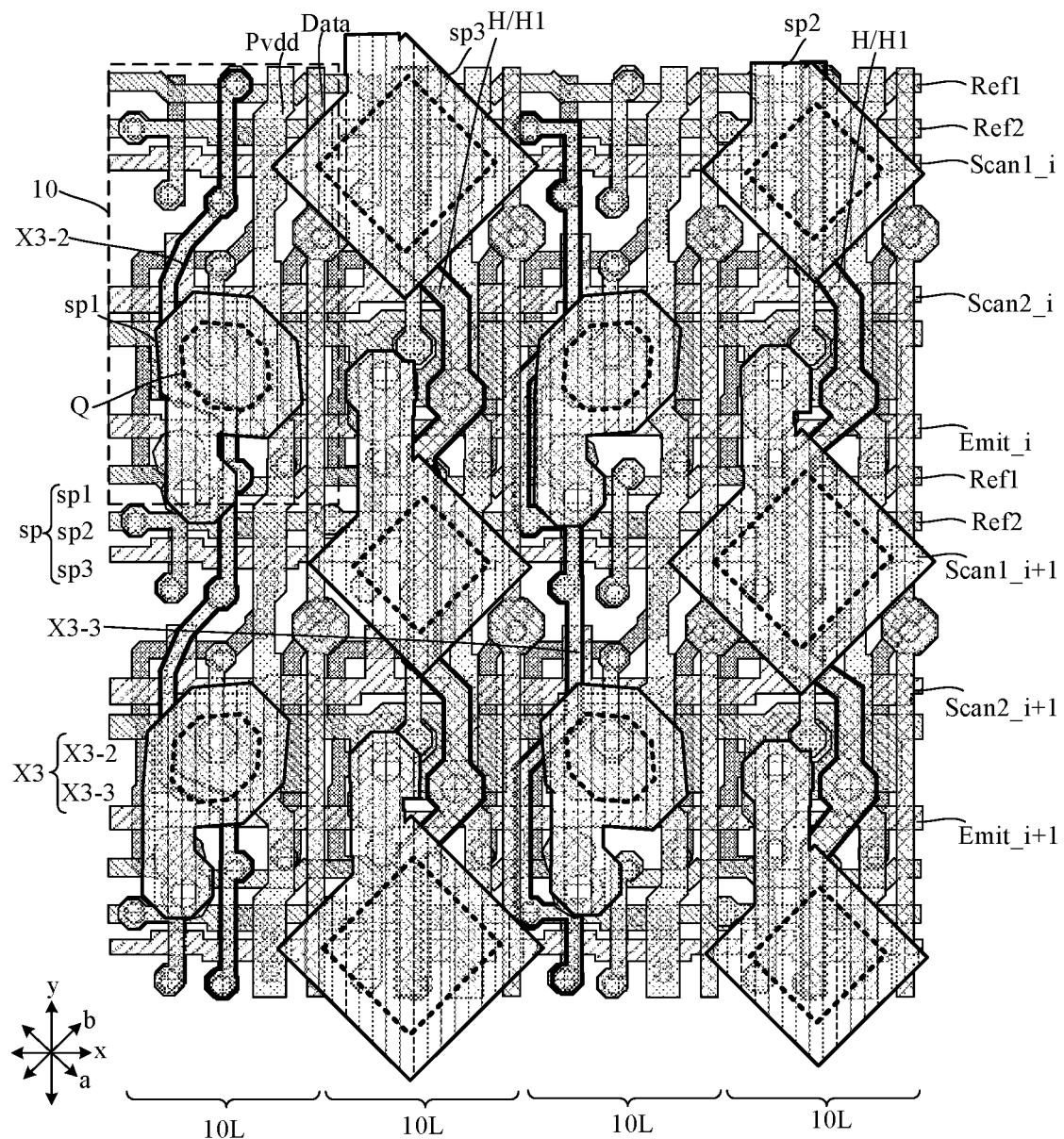
FIG. 16 is a schematic diagram of another display panel according to an embodiment of the present disclosure.

In the embodiment shown in FIG. 15, the first signal sub-line H1 overlaps with the first sub-pixel sp1, and the third signal line X3 overlaps with the second sub-pixel sp2 and the third sub-pixel sp3. In other embodiments, FIG. 16 is a schematic diagram of another display panel according to an embodiment of the present disclosure. As shown in FIG. 16, the third signal line X3 includes a second signal sub-line X3-2 and a third signal sub-line X3-3. The second signal sub-line X3-2 is electrically connected to the first reset signal line Ref1, and the third signal sub-line X3-3 is electrically connected to the second reset signal line Ref2. The second signal sub-line X3-2 overlaps with one pixel circuit column 10L, and the third signal sub-line X3-3 overlaps with one pixel circuit column 10L. The second signal sub-line X3-2 and the third signal sub-line X3-3 both overlap with the first sub-pixel sp1. The first signal sub-line H1 overlaps with the second sub-pixel sp2 and the third sub-pixel sp3. The first signal sub-line H1 overlaps with the center of the light-emitting region Q of the second sub-pixel sp2 at the overlapping position with the second sub-pixel sp2, and overlaps with the center of the light-emitting region Q of the third sub-pixel sp3 at the overlapping position with the third sub-pixel sp3.

Figure 17:
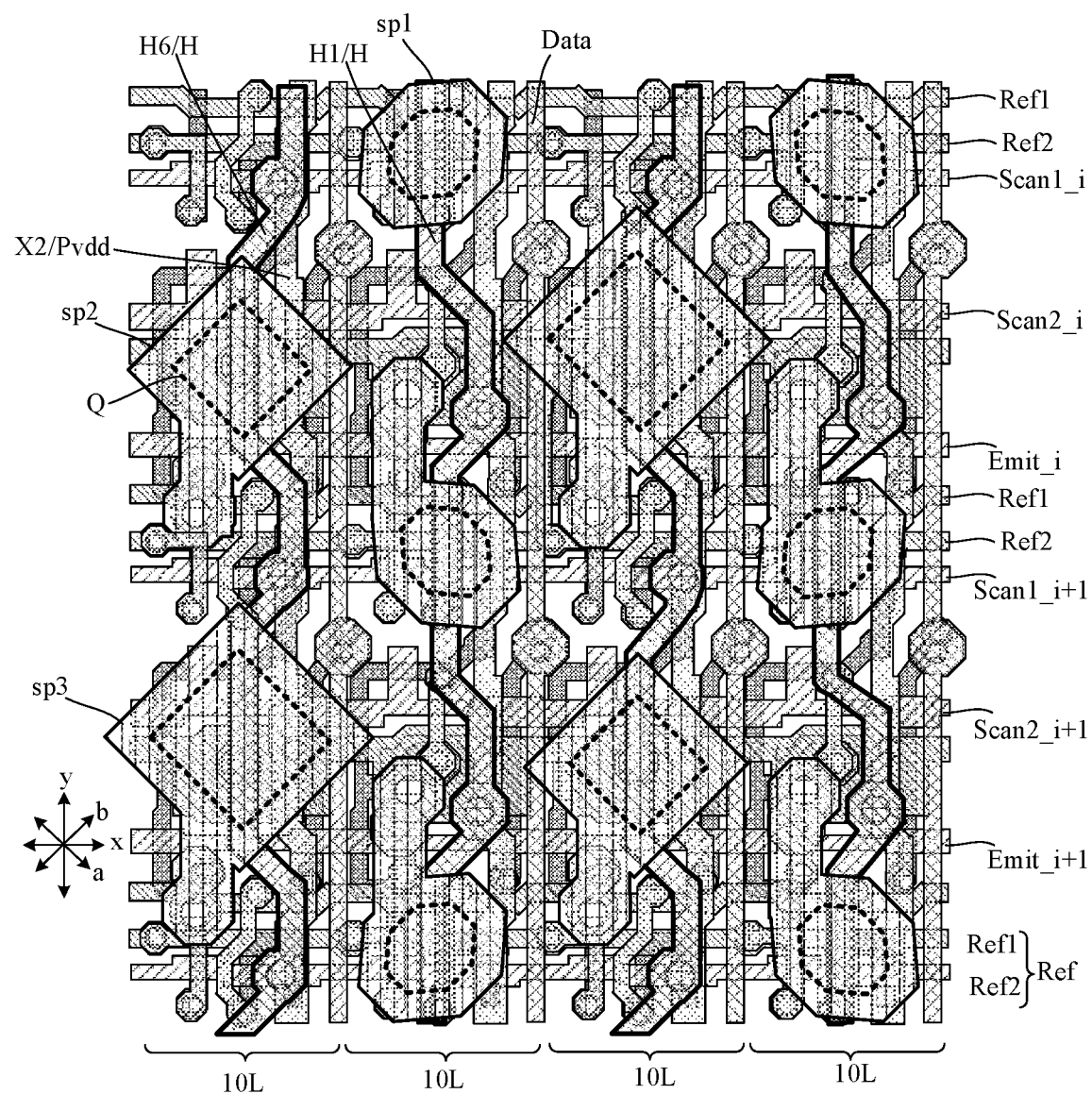
FIG. 17 is a schematic diagram of another display panel according to an embodiment of the present disclosure.

In some embodiments, FIG. 17 is a schematic diagram of another display panel according to an embodiment of the present disclosure. As shown in FIG. 17, the first signal line H includes a first signal sub-line H1 and a sixth signal sub-line H6. The sixth signal sub-line H6 overlaps with the center of the light-emitting region Q of the sub-pixel sp, and the first signal sub-line H1 overlaps with the center of the light-emitting region Q of the sub-pixel sp. Both the sixth signal sub-line H6 and the first signal sub-line H1 are located in the first metal layer 011. The sixth signal sub-line H6 and the first signal sub-line H1 are located in different pixel circuit columns 10L. In this embodiment, the sixth signal sub-line H6 and the first signal sub-line H1 can transmit the same signal or different signals. By setting the first signal sub-line H1 and the sixth signal sub-line H6 in different pixel circuit columns 10L, the metal line arrangement in the first metal layer 011 can be designed reasonably. The first signal line H has a small impact on the wiring space of the display panel, which meets the needs of wiring design for high resolution.

As shown in FIG. 17, the second signal line X2 is a power signal line Pvdd, and both the sixth signal sub-line H6 and the first signal sub-line H1 transmit the power voltage signal. The sixth signal sub-lines H6 and the first signal sub-lines H1 are arranged alternately along the third direction x. In this embodiment, the sixth signal sub-line H6 and the first signal sub-line H1 can reduce the voltage drop during transmission of the power signal and improve the uniformity of the power signal in the entire display panel. Furthermore, the shape of the sixth signal sub-line H6 is different from that of the first signal sub-line H1. The shape of the sixth signal sub-line H6 and the shape of the first signal sub-line H1 are designed to match the layout of the sub-pixels sp, such that the sixth signal sub-line H6 overlaps with the center of the light-emitting region Q of the sub-pixel sp, and the first signal sub-line H1 also overlaps with the center of the light-emitting region Q of the sub-pixel sp, which can balance the brightness differences of the sub-pixels sp under different viewing angles, thereby alleviating the four-directional color shift of the display panel and enhancing the display effect.

Figure 18:
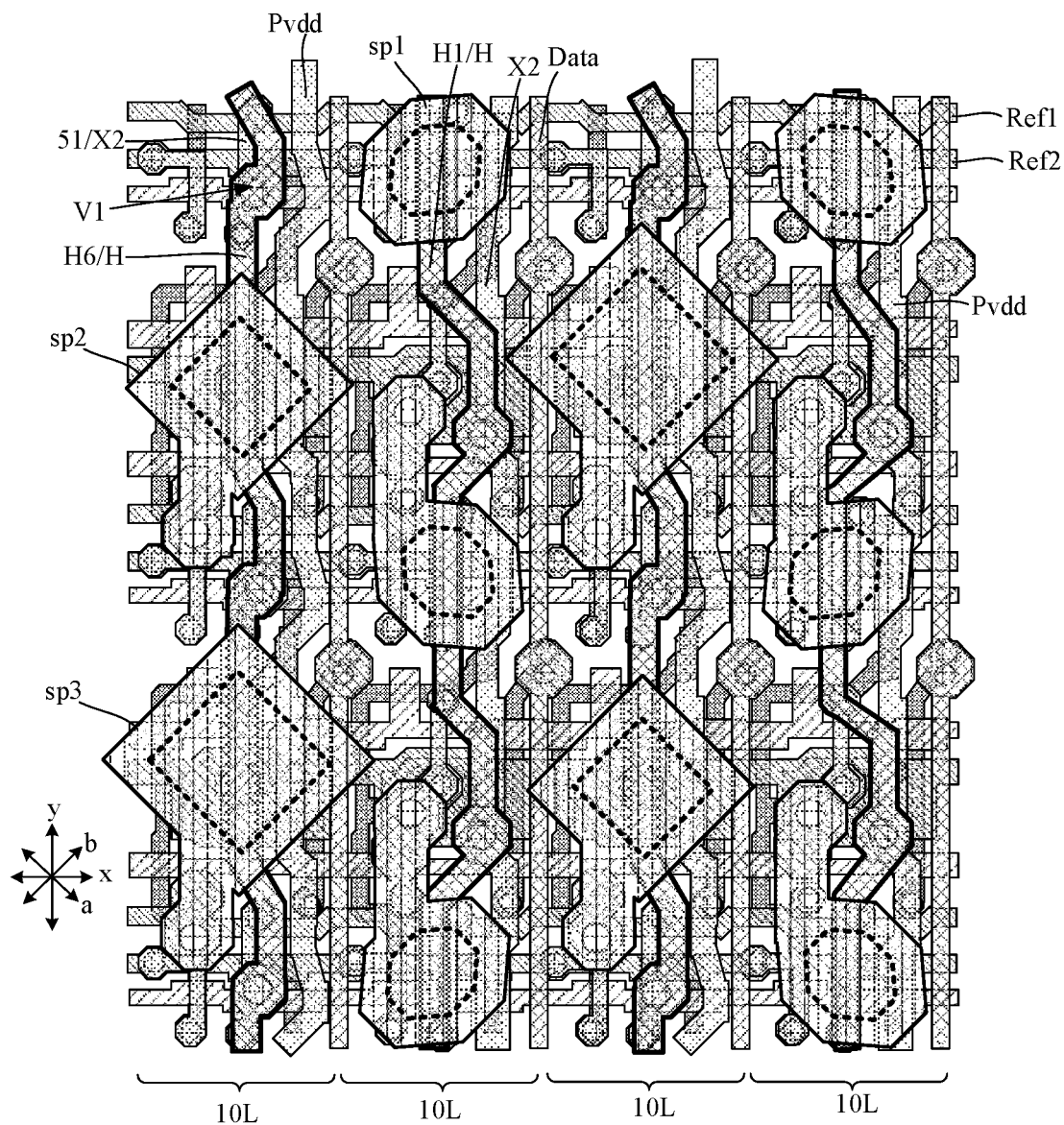
FIG. 18 is a schematic diagram of another display panel according to an embodiment of the present disclosure.

In other embodiments, FIG. 18 is a schematic diagram of another display panel according to an embodiment of the present disclosure. As shown in FIG. 18, the first signal line H includes a first signal sub-line H1 and a sixth signal sub-line H6. The first signal sub-line H1 is connected to the power signal line Pvdd through a via, and the first signal sub-line H1 transmits a power signal. The sixth signal sub-line H6 transmits a reset signal. FIG. 18 shows that the sixth signal sub-line H6 is connected to the first connection line 51 through a first via V1, that is, the sixth signal sub-line H6 is connected to the first reset signal line Ref1. In this embodiment, the second signal line X2 includes the power signal line Pvdd and the first connection line 51. In the pixel circuit column 10L where the sixth signal sub-line H6 is located, the power signal line Pvdd avoids the first via V1 through which the sixth signal sub-line H6 and the first connection line 51 are connected. The first signal sub-lines H1 and the sixth signal sub-lines H6 are arranged alternately along the third direction x. In this embodiment, the sixth signal sub-line H6 is used to reduce the voltage drop during transmission of the reset signal, and the first signal sub-line H1 is used to reduce the voltage drop during transmission of the power signal. The shape of the sixth signal sub-line H6 and the shape of the first signal sub-line H1 are designed to match with the layout of the sub-pixels sp, such that the sixth signal sub-line H6 overlaps with the center of the light-emitting region Q of the sub-pixel sp, and the first signal sub-line H1 also overlaps with the center of the light-emitting region Q of the sub-pixel sp. This can balance the brightness differences of the sub-pixels sp under different viewing angles, thereby alleviating the four-directional color shift of the display panel and enhancing the display effect.

FIG. 18 shows that the sixth signal sub-line H6 is connected to the first reset signal line Ref1. In other embodiments, multiple sixth signal sub-lines H6 are arranged along the third direction x and include sixth signal sub-lines H6 electrically connected to the first reset signal line Ref1 and sixth signal sub-lines H6 electrically connected to the second reset signal line Ref2, and the sixth signal sub-lines H6 electrically connected to the first reset signal line Ref1 and sixth signal sub-lines H6 electrically connected to the second reset signal line Ref2 are arranged alternately, such that the voltage drop during transmission of the first reset signal and the second reset signal can be reduced.

Figure 19:
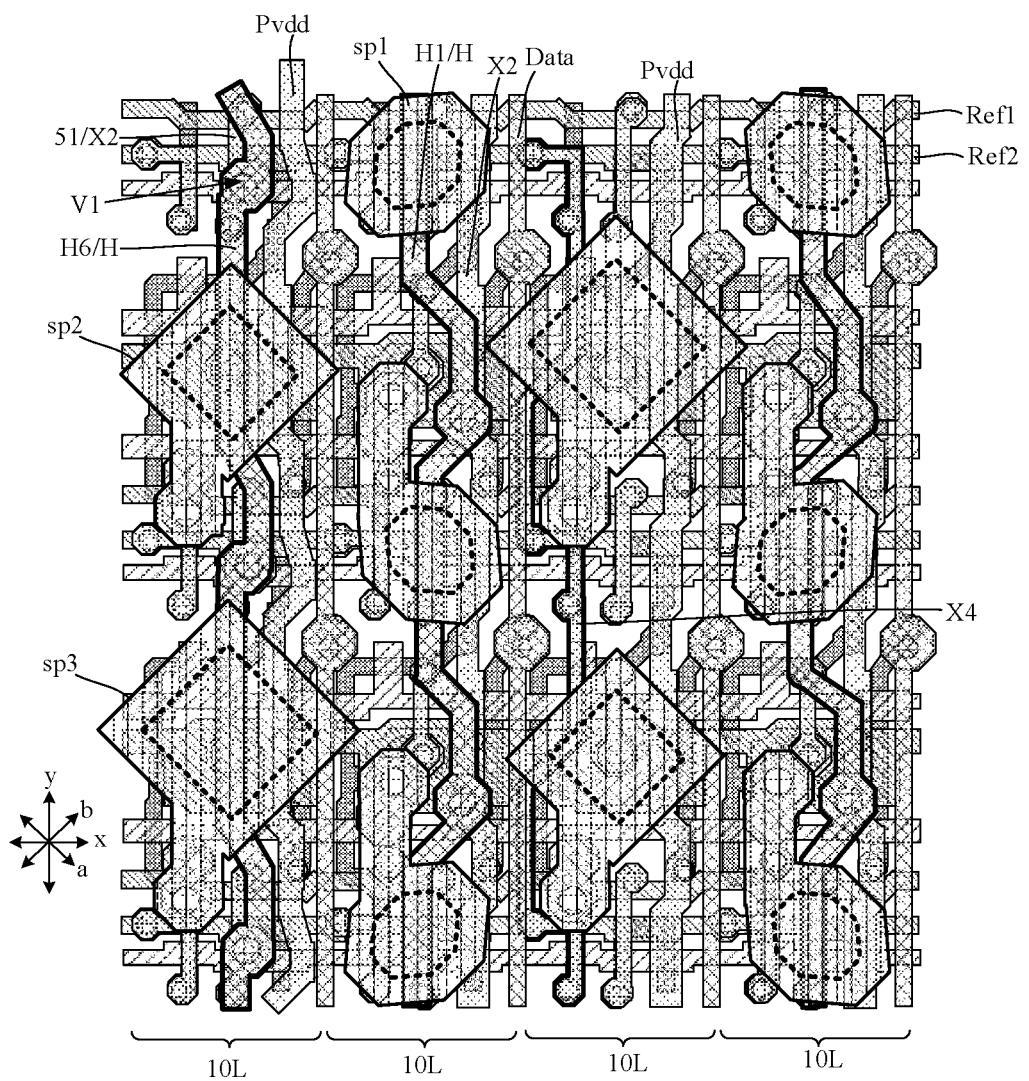
FIG. 19 is a schematic diagram of another display panel according to an embodiment of the present disclosure.

In other embodiments, FIG. 19 is a schematic diagram of another display panel according to an embodiment of the present disclosure. As shown in FIG. 19, the first signal line H includes a first signal sub-line H1 and a sixth signal sub-line H6. The first signal sub-line H1 is connected to the power signal line Pvdd through a via and transmits the power signal. The sixth signal sub-line H6 transmits the reset signal. The display panel is further provided with a fourth signal line X4 extending along the fourth direction y, and the fourth signal line X4 is located in the second metal layer 012. The sixth signal sub-line H6 and the fourth signal line X4 adjacent to each other in the third direction x are spaced apart by one pixel circuit column 10L. The sixth signal sub-lines H6 and the fourth signal lines X4 arranged alternately along the third direction x are connected to the first reset signal line Ref1 and the second reset signal line Ref2 alternately. FIG. 19 shows that the sixth signal sub-line H6 is connected to the first connection line 51 through the first via V1, that is, the sixth signal sub-line H6 is connected to the first reset signal line Ref1. In this case, the fourth signal line X4 is connected to the second reset signal line Ref2. In this embodiment, the first signal sub-line H1 is used to reduce the voltage drop during transmission of the power signal, and the sixth signal sub-line H6 and the fourth signal line X4 are used to reduce the voltage drop during transmission of the reset signal. In addition, the shape of the sixth signal sub-line H6 and the shape of the first signal sub-line H1 are designed to match with the layout of the sub-pixels sp, such that the sixth signal sub-line H6 overlaps with the center of the light-emitting region Q of the sub-pixel sp, and the first signal sub-line H1 also overlaps with the center of the light-emitting region Q of the sub-pixel sp. This can balance the brightness differences of the sub-pixels sp under different viewing angles, thereby alleviating the four-directional color shift of the display panel.

Figure 20:
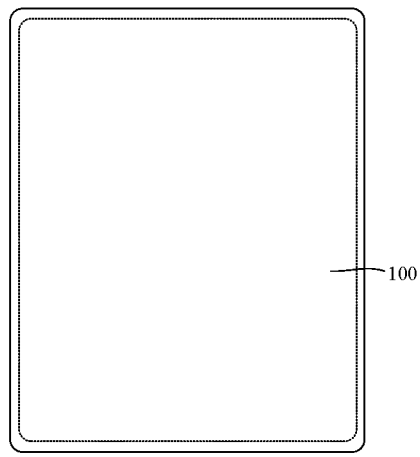
FIG. 20 is a schematic diagram of a display apparatus according to an embodiment of the present disclosure.

Based on a same inventive concept, an embodiment of the present disclosure further provides a display apparatus. FIG. 20 is a schematic diagram of a display apparatus according to an embodiment of the present disclosure. As shown in FIG. 20, the display apparatus includes the display panel 100 provided in any embodiment of the present disclosure. The structure of the display panel 100 has been described in the foregoing embodiments, and details are not described herein again. The display apparatus provided by the embodiment of the present disclosure may be a display product such as a mobile phone, a tablet computer, a television, a notebook computer, or an intelligent wearable product.

The above descriptions are merely some embodiments of the present disclosure, and are not intended to limit the present disclosure. Any modifications, equivalent replacements, improvements, and the like made within the spirit and principle of the present disclosure shall fall within the protection scope of the present disclosure.

Finally, it should be noted that the foregoing embodiments are merely intended to describe and not to limit the technical solutions of the present disclosure. Although the present disclosure has been described in detail with reference to the foregoing embodiments, persons skilled in the art should understand that they can still make modifications to the technical solutions described in the foregoing embodiments or make equivalent replacements to some or all of the technical features thereof. These modifications or replacements do not make the essence of the corresponding technical solutions deviate from the scope of the technical solutions of the embodiments of the present disclosure.

What is claimed is:

1. A display panel comprising: a substrate; a drive layer; and a pixel layer, the pixel layer being located at a side of the drive layer away from the substrate,
    wherein the drive layer comprises a first metal layer that is closer to the pixel layer than other metal layers in the drive layer, the first metal layer comprises data lines and a first signal line, the data lines extend in a same direction as the first signal line, and the first signal line transmits a constant voltage signal, and
    the pixel layer comprises a plurality of sub-pixels each comprising a light-emitting region located between adjacent data lines of the data lines, and the first signal line overlaps with centers of the light-emitting regions of some of the plurality of sub-pixels.

2. The display panel according to claim 1, wherein the plurality of sub-pixels comprise first sub-pixels, second sub-pixels, and third sub-pixels that emit lights of different colors,
    the plurality of sub-pixels define a plurality of first pixel rows and a plurality of second pixel rows that are arranged alternately along a first direction, and
    each first pixel row comprises at least two of the first sub-pixels and at least two of the second sub-pixels that are arranged alternately along a second direction, and each second pixel row comprises at least two of the first sub-pixels and at least two of the third sub-pixels that are arranged alternately along the second direction, the second direction intersecting with the first direction.

3. The display panel according to claim 2, wherein the plurality of sub-pixels define a plurality of first pixel columns and a plurality of second pixel columns that are arranged alternately along the second direction, and
    each first pixel column comprises at least two of the first sub-pixels and at least two of the second sub-pixels that are arranged alternately along the first direction, and each second pixel column comprises at least two of the first sub-pixels and at least two of the third sub-pixels that are arranged alternately along the first direction.

4. The display panel according to claim 3, wherein the drive layer further comprises a plurality of pixel circuits electrically connected to the plurality of sub-pixels, and the plurality of pixel circuits each comprise a drive transistor, and
    one of the first sub-pixels overlaps with one of drive transistors of the plurality of pixel circuits, or one of the second sub-pixels overlaps with one of the drive transistors of the plurality of pixel circuits, and one of the third sub-pixels overlaps with one of the drive transistors of the plurality of pixel circuits.

5. The display panel according to claim 3, wherein each of the plurality of sub-pixels comprises a patterned first electrode, and
    the first electrode of each first sub-pixel does not overlap with the data lines.

6. The display panel according to claim 1, wherein the drive layer further comprises a second metal layer located at a side of the first metal layer adjacent to the substrate, and the second metal layer comprises a second signal line extending in the same direction as the first signal line, and
    the first signal line is electrically connected to the second signal line through a first via, and the first via does not overlap with the plurality of sub-pixels.

7. The display panel according to claim 6, wherein an insulation layer between the first metal layer and the second metal layer is an organic insulation layer.

8. The display panel according to claim 6, wherein each of the plurality of sub-pixels comprises a patterned first electrode, and
    the drive layer further comprises a plurality of pixel circuits electrically connected to the plurality of sub-pixels,
    the first metal layer further comprises first connection electrodes, and each pixel circuit is electrically connected to one of the first electrodes through one of the first connection electrodes, and
    the first signal line comprises a first segment, and at least a part of the first segment bypasses the first connection electrode from one side of the first connection electrode.

9. The display panel according to claim 8, wherein each pixel circuit comprises a storage capacitor, and the first segment of the first signal line at least partially overlaps with the storage capacitor; and
    the second metal layer further comprises a power signal line, the power signal line transmits a power voltage signal and comprises a second segment, wherein the second segment at least partially overlaps with the storage capacitor and at least partially overlaps with the first segment.

10. The display panel according to claim 9, wherein the second signal line comprises the power signal line, and the first via connecting the first signal line and the second signal line at least partially overlaps with the storage capacitor.

11. The display panel according to claim 6, wherein each pixel circuit comprises a drive transistor, the drive layer further comprises a third metal layer located at a side of the second metal layer adjacent to the substrate, the third metal layer comprises a reset signal line for transmitting a reset signal, and an extension direction of the reset signal line intersects with an extension direction of a data line,
    the second metal layer further comprises a reset connection line electrically connected between the reset signal line and the reset transistor,
    the second signal line comprises the reset connection line,
    the drive layer further comprises a node connection line located in the second metal layer, and the node connection line is electrically connected to a gate of the drive transistor, and
    the first via connecting the first signal line and the second signal line is located between the node connection line and the data line.

12. The display panel according to claim 6, wherein each pixel circuit comprises a drive transistor, the drive layer further comprises a third metal layer located at a side of the second metal layer adjacent to the substrate, the third metal layer comprises a reset signal line for transmitting a reset signal, and an extension direction of the reset signal line intersects with an extension direction of the data line, the second metal layer further comprises a reset connection line electrically connected between the reset signal line and the reset transistor, and the first via connecting the second signal line and the first signal line is located between the reset connection line and the data line, and the reset connection line bypasses the first via from one side of the first via.

13. The display panel according to claim 6, wherein the first signal line comprises a first signal sub-line, and the first signal sub-line transmits a power voltage signal, at least one segment of the second signal line overlaps with one of the plurality of sub-pixels, and the plurality of sub-pixels comprise a sub-pixel overlapping with both the first signal sub-line and the second signal line, and wherein in the sub-pixel, the second signal line does not overlap with the first signal sub-line.

14. The display panel according to claim 13, wherein the drive layer further comprises a plurality of pixel circuits electrically connected to the plurality of sub-pixels, and each of the plurality of pixel circuits comprises a reset transistor, the drive layer further comprises a third metal layer located at a side of the second metal layer adjacent to the substrate and comprising a reset signal line, the reset signal line transmits a reset signal, and an extension direction of the reset signal line intersects with an extension direction of a data line, the second metal layer further comprises a reset connection line electrically connected between the reset signal line and the reset transistor, the plurality of sub-pixels comprise the sub-pixel overlapping with both the first signal sub-line and the second signal line, and wherein in the sub-pixel, the reset connection line overlaps with the first signal sub-line.

15. The display panel according to claim 1, wherein the drive layer further comprises a plurality of pixel circuits electrically connected to the plurality of sub-pixels, the plurality of pixel circuits define a plurality of pixel circuit columns arranged along a third direction, and each pixel circuit column comprises multiple pixel circuits of the plurality of pixel circuits arranged along a fourth direction, the third direction intersecting with the fourth direction, and a data line and the first signal line extend along the fourth direction, and the first signal line comprises first signal sub-lines, and two adjacent first signal lines are spaced apart by one pixel circuit column.

16. The display panel according to claim 15, wherein the drive layer further comprises a reset signal line extending along the third direction and transmitting a reset signal, the second metal layer further comprises third signal lines electrically connected to the reset signal line, and two third signal lines of the third signal lines adjacent along the third direction are spaced apart by one pixel circuit column, and the third signal lines and the first signal sub-lines are located in different pixel circuit columns and are arranged alternately along the third direction.

17. The display panel according to claim 16, wherein the reset signal line comprises a first reset signal line and a second reset signal line, and voltage values of signals transmitted by the first reset signal line and the second reset signal line are different, a third signal line comprises a second signal sub-line and a third signal sub-line, the second signal sub-line is electrically connected to the first reset signal line, and the third signal sub-line is electrically connected to the second reset signal line, and the second signal sub-line overlaps with one pixel circuit column, and the third signal sub-line overlaps with one pixel circuit column.

18. The display panel according to claim 16, wherein the reset signal line comprises a first reset signal line and a second reset signal line, and voltage values of signals transmitted by the first reset signal line and the second reset signal line are different, a third signal line comprises fourth signal sub-lines and fifth signal sub-lines, the fourth signal sub-lines are electrically connected to the first reset signal line, and the fifth signal sub-lines are electrically connected to the second reset signal line, one fourth signal sub-line overlaps with one sub-pixel, and one fifth signal sub-line overlaps with one sub-pixel, and the fourth signal sub-lines and the fifth signal sub-lines corresponding to one pixel circuit column are arranged alternately along the fourth direction.

19. The display panel according to claim 18, wherein the plurality of sub-pixels comprise first sub-pixels, second sub-pixels, and third sub-pixels that emit lights of different colors, and all the sub-pixels overlapping with the first signal sub-line are the first sub-pixels, all the sub-pixels overlapping with the fourth signal sub-line are the second sub-pixels, and all the sub-pixels overlapping with the fifth signal sub-line are the third sub-pixels.

20. The display panel according to claim 15, wherein the first signal line comprises sixth signal sub-lines, and the sixth signal sub-lines and the first signal sub-lines are located in different pixel circuit columns.

21. The display panel according to claim 20, wherein the sixth signal sub-lines transmit a power voltage signal, and the first signal sub-lines and the sixth signal sub-lines are arranged alternately along the third direction.

22. The display panel according to claim 20, wherein the sixth signal sub-lines transmit a reset signal, and the first signal sub-lines and the sixth signal sub-lines are arranged alternately along the third direction.

23. The display panel according to claim 22, wherein the drive layer further comprises a first reset signal line and a second reset signal line that extend along the third direction, and voltage values of signals transmitted by the first reset signal line and the second reset signal line are different, and the sixth signal sub-lines arranged along the third direction comprise sixth signal sub-lines connected to the first reset signal line and sixth signal sub-lines connected to the second reset signal line, and the sixth signal sub-lines connected to the first reset signal line are arranged alternately with the sixth signal sub-lines connected to the second reset signal line.

24. The display panel according to claim 20, wherein the sixth signal sub-lines transmit a reset signal, the drive layer further comprises a first reset signal line and a second reset signal line that extend along the third direction, and voltage values of signals transmitted by the first reset signal line and the second reset signal line are different, the second metal layer further comprises fourth signal lines extending along the fourth direction and arranged alternately with the sixth signal sub-lines along the third direction, the sixth signal sub-line and the fourth signal line adjacent in the third direction are spaced apart by one pixel circuit column, the sixth signal sub-lines are connected to the first reset signal line, and the fourth signal lines are connected to the second reset signal line or the sixth signal sub-lines are connected to the second reset signal line, and the fourth signal lines are connected to the first reset signal line.

25. A display apparatus comprising a display panel, wherein the display panel comprises: a substrate; a drive layer; and a pixel layer, the pixel layer being located at a side of the drive layer away from the substrate, wherein the drive layer comprises a first metal layer that is closer to the pixel layer than other metal layers in the drive layer, the first metal layer comprises data lines and a first signal line, the data lines extend in a same direction as the first signal line, and the first signal line transmits a constant voltage signal, and the pixel layer comprises a plurality of sub-pixels each comprising a light-emitting region located between adjacent data lines of the data lines, and the first signal line overlaps with centers of the light-emitting regions of some of the plurality of sub-pixels.

* * * * *